(12) United States Patent
Lee et al.

(10) Patent No.: US 11,871,687 B2
(45) Date of Patent: Jan. 9, 2024

(54) RESISTIVE SWITCHING ELEMENT AND MEMORY DEVICE INCLUDING THE SAME

(71) Applicants: AJOU UNIVERSITY INDUSTRY-ACADEMIC COOPERATION FOUNDATION, Suwon-si (KR); INDUSTRY-UNIVERSITY COOPERATION FOUNDATION HANYANG UNIVERSITY ERICA CAMPUS, Ansan-si (KR)

(72) Inventors: Sang Woon Lee, Suwon-si (KR); Tae Joo Park, Ansan-si (KR); Hae Jun Jung, Suwon-si (KR); Sung Min Kim, Incheon (KR); Hye Ju Kim, Suwon-si (KR); Seong Hwan Kim, Seoul (KR)

(73) Assignees: AJOU UNIVERSITY INDUSTRY-ACADEMIC COOPERATION FOUNDATION, Suwon-si (KR); INDUSTRY-UNIVERSITY COOPERATION FOUNDATION HANYANG UNIVERSITY ERICA CAMPUS, Ansan-si (KR)

( * ) Notice: Subject to any disclaimer, the term of this patent is extended or adjusted under 35 U.S.C. 154(b) by 133 days.

(21) Appl. No.: 17/760,967

(22) PCT Filed: Sep. 17, 2020

(86) PCT No.: PCT/KR2020/012550
§ 371 (c)(1),
(2) Date: Mar. 16, 2022

(87) PCT Pub. No.: WO2021/054737
PCT Pub. Date: Mar. 25, 2021

(65) Prior Publication Data
US 2022/0407002 A1    Dec. 22, 2022

(30) Foreign Application Priority Data
Sep. 17, 2019 (KR) .................. 10-2019-0113858

(51) Int. Cl.
*G11C 11/22* (2006.01)
*H10N 70/00* (2023.01)
*H10B 63/00* (2023.01)

(52) U.S. Cl.
CPC ......... *H10N 70/8833* (2023.02); *H10B 63/80* (2023.02); *H10N 70/023* (2023.02); *H10N 70/066* (2023.02); *H10N 70/841* (2023.02)

(58) Field of Classification Search
CPC ..................................................... G11C 11/22
(Continued)

(56) References Cited

U.S. PATENT DOCUMENTS 8,890,142 B2 * 11/2014 Baek ................... H01L 29/7786
257/E29.086
2014/0361864 A1    12/2014 Fukuda et al.

FOREIGN PATENT DOCUMENTS

KR    10-2010-0104015 A    9/2010
KR    10-2012-0006018 A    1/2012
(Continued)

OTHER PUBLICATIONS

International Search Report for PCT/KR2020/012550 dated Dec. 8, 2020 (PCT/ISA/210).

*Primary Examiner* — Jason Lappas
(74) *Attorney, Agent, or Firm* — Sughrue Mion, PLLC

(57) ABSTRACT

Disclosed is a resistive switching element. The resistive switching element includes a first oxide layer and a second oxide layer stacked one on top of the other such that an interface is present therebetween, wherein the first oxide layer and the second oxide layer are made of different metal oxides; two-dimensional electron gas (2DEG) present in the (Continued)

interface between the first oxide layer and the second oxide layer and functioning as an inactive electrode; and an active electrode disposed on the second oxide layer, wherein when a positive bias is applied to the active electrode, an electric field is generated between the active electrode and the two-dimensional electron gas, such that the second oxide layer is subjected to the electric field, and active metal ions from the active electrode are injected into the second oxide layer. The resistive switching element realizes highly uniform resistive switching operation.

17 Claims, 17 Drawing Sheets

(58) Field of Classification Search
USPC .......................................................... 365/109
See application file for complete search history.

(56) References Cited

FOREIGN PATENT DOCUMENTS

| KR | 10-1450093 B1 | 10/2014 |
| KR | 10-2018-0123915 A | 11/2018 |

\* cited by examiner

RESISTIVE SWITCHING ELEMENT AND MEMORY DEVICE INCLUDING THE SAME

FIELD

The present disclosure relates to a resistive switching element capable of reliably performing a highly uniform resistive switching operation and a memory device having the same.

DESCRIPTION OF RELATED ART

A resistive switching memory element has recently received a lot of attention as an element employed in a next-generation non-volatile memory device that may replace a flash memory.

The resistive switching memory element has fast switching rate, high integration, and simple configuration. In general, the resistive switching element includes a metal oxide as a resistive switching material, and operates based on generation and extinction of a filament inside the metal oxide layer.

However, despite the many advantages of the resistive switching memory element, there are currently several shortages thereof that need to be overcome. In this connection, achieving uniform resistive switching characteristics in which the switching operation occurs at constant set and reset voltages is the most necessary for commercialization of the resistive switching memory device.

DISCLOSURE

Technical Purposes

One purpose of the present disclosure is to provide a resistive switching element capable of performing a highly uniform resistive switching operation by employing two-dimensional electron gas acting as an inactive electrode.

Another purpose of the present disclosure is to provide a memory device including the resistive switching element.

Technical Solutions

One aspect of the present disclosure provides a resistive switching element comprising: a first oxide layer and a second oxide layer stacked one on top of the other such that an interface is present therebetween, wherein the first oxide layer and the second oxide layer are made of different metal oxides; two-dimensional electron gas (2DEG) present in the interface between the first oxide layer and the second oxide layer and functioning as an inactive electrode; and an active electrode disposed on the second oxide layer, wherein when a positive bias is applied to the active electrode, an electric field is generated between the active electrode and the two-dimensional electron gas, such that the second oxide layer is subjected to the electric field, and active metal ions from the active electrode are injected into the second oxide layer.

In one implementation of the resistive switching element, each of the first and second oxide layers is made of a metal oxide including at least one metal element selected from a group consisting of titanium (Ti), zinc (Zn), aluminum (Al), hafnium (Hf), zirconium (Zr), gallium (Ga) and tungsten (W). In one implementation of the resistive switching element, each of the first and second oxide layers is made of a metal oxide selected from a group consisting of titanium oxide, zinc oxide, aluminum oxide, hafnium oxide, zirconium oxide, gallium oxide and tungsten oxide. In one implementation of the resistive switching element, the first oxide layer is made of titanium dioxide ($TiO_2$) or strontium titanate ($SrTiO_3$) while the second oxide layer is made of aluminum oxide ($Al_2O_3$), lanthanum aluminate ($LaAlO_3$), tungsten trioxide ($WO_3$) or tungsten dioxide ($WO_2$).

In one implementation of the resistive switching element, the active electrode is made of an electrically conductive material including copper (Cu) or silver (Ag). In one implementation of the resistive switching element, the active electrode includes: an active metal layer made of an active metal including copper (Cu) or silver (Ag); and a buffer layer made of titanium (Ti) and disposed between the active metal layer and the second oxide layer.

In one implementation of the resistive switching element, when the positive bias is applied to the active electrode such that a first electric field is generated between the active electrode and the two-dimensional electron gas, a conductive filament electrically connecting the active electrode and the two-dimensional electron gas to each other is formed inside the second oxide layer so that the second oxide layer is brought into a low resistance state (LRS), wherein when a negative bias is applied to the active electrode such that a second electric field having a direction opposite to a direction of the first electric field is generated between the active electrode and the two-dimensional electron gas, a portion of the conductive filament adjacent to the two-dimensional electron gas is destroyed such that the second oxide layer is brought into a high resistance state (HRS).

In one implementation of the resistive switching element, when the second oxide layer is in the high resistance state, a tunnel gap between an end of the filament and the two-dimensional electron gas is in a range of 0.1 to 0.5 nm.

In one implementation of the resistive switching element, when the second oxide layer is in the low resistance state, a resistance of the conductive filament is in a range of 95% to 105% of a resistance of the two-dimensional electron gas.

In one implementation of the resistive switching element, different voltages are respectively applied to the active electrode and the two-dimensional electron gas.

Another aspect of the present disclosure provides a memory device comprising: a plurality of resistive switching elements arranged in a matrix of M×N along a first horizontal direction and a second horizontal direction intersecting with each other; a plurality of first signal lines arranged to be spaced apart from each other in the second horizontal direction, wherein each of the plurality of first signal lines extends in the first horizontal direction and is electrically connected to active electrodes of M resistive switching elements arranged in a line along the first horizontal direction among the plurality of resistive switching elements; and a plurality of second signal lines arranged to be spaced apart from each other in the first horizontal direction, wherein each of the plurality of second signal lines extends in the second horizontal direction and is electrically connected to two-dimensional electron gases of N resistive switching elements arranged in a line along the second horizontal direction among the plurality of resistive switching elements, wherein each of the plurality of resistive switching elements includes: a first oxide layer and a second oxide layer stacked one on top of the other such that an interface is present therebetween, wherein the first oxide layer and the second oxide layer are made of different metal oxides; the two-dimensional electron gas (2DEG) present in the interface between the first oxide layer and the second oxide layer and functioning as an inactive electrode; and the active electrode disposed on the second oxide layer, wherein when a positive bias is applied to the active electrode via the first signal line, an electric field is generated between the active electrode and the two-dimensional electron gas, such that the second oxide layer is subjected to the electric field, and active metal ions from the active electrode are injected into the second oxide layer.

In one implementation of the memory device, each of the plurality of resistive switching elements further includes a support structure disposed on a corresponding one of the second signal lines and having a columnar structure, wherein the first oxide layer covers side and top faces of the support structure, wherein the second oxide layer are disposed on the side and top faces of the support structure so as to directly cover the first oxide layer.

In one implementation of the memory device, the support structure has the columnar structure having a circular or polygonal cross-sectional shape.

In one implementation of the memory device, each of the second signal lines are in direct contact with exposed bottom faces of the two-dimensional electron gases coplanar with bottom faces of the support structures.

In one implementation of the memory device, when the positive bias is applied to the active electrode such that a first electric field is generated between the active electrode and the two-dimensional electron gas, a conductive filament electrically connecting the active electrode and the two-dimensional electron gas to each other is formed in a portion of the second oxide layer between a top face of the support structure and the active electrode so that the second oxide layer is brought into a low resistance state (LRS), wherein when a negative bias is applied to the active electrode such that a second electric field having a direction opposite to a direction of the first electric field is generated between the active electrode and the two-dimensional electron gas, a portion of the conductive filament adjacent to the two-dimensional electron gas is destroyed such that the second oxide layer is brought into a high resistance state (HRS).

In one implementation of the memory device, the device further comprises a filling layer fills a space between adjacent ones of the plurality of resistive switching elements, wherein the active electrodes of the resistive switching elements are exposed through openings defined in a top portion of the filling layer and are electrically connected to the first signal lines.

In one implementation of the memory device, the filling layer includes a first layer filling the space between adjacent ones of the resistive switching elements, and a second layer formed on a top face of the first layer, wherein the first layer exposes a portion of a top face of the second oxide layer of each of the resistive switching elements, wherein the second layer has the openings defined therein through which the active electrodes of the resistive switching elements respectively extend.

Technical Effects

According to the resistive switching element and the memory device based on the present disclosure, the two-dimensional electron gas may be used as the inactive electrode. Thus, a relatively smaller filament may be formed inside the second oxide layer, and an extremely short tunnel gap (<0.5 nm) may be formed, thereby improving controllability of filament formation and breakage. As a result, very uniform resistive switching characteristics may be realized. In addition, the memory device may exhibit excellent durability greater than or equal to about $10^7$ cycles, and may retain data for a time duration greater than or equal to $10^6$ s even under severe conditions of 85° C.

DETAILED DESCRIPTIONS

Figure 1:
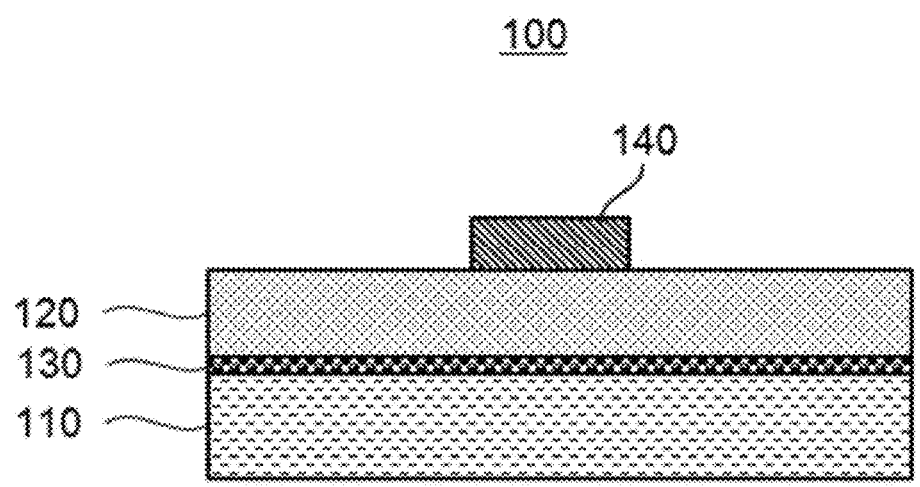
FIG. 1 is a cross-sectional view for illustrating a resistive switching element according to an embodiment of the present disclosure.

Hereinafter, an embodiment of the present disclosure will be described in detail with reference to the accompanying drawings. The present disclosure may be variously modified and may take many forms. Thus, specific embodiments will be illustrated in the drawings and described in detail herein. However, the specific embodiments are not intended to limit the present disclosure thereto. It should be understood that all changes, equivalents thereto, or substitutes therewith are included in a scope and spirit of the present disclosure. In describing the drawing, similar reference numerals are used for similar components. For simplicity and clarity of illustration, elements in the figures are not necessarily drawn to scale.

The terminology used herein is for the purpose of describing particular embodiments only and is not intended to be limiting of the present disclosure. As used herein, the singular forms "a" and "an" are intended to include the plural forms as well, unless the context clearly indicates otherwise. It will be further understood that the terms "comprises", "comprising", "includes", and "including" when used in this specification, specify the presence of the stated features, integers, operations, elements, and/or components, but do not preclude the presence or addition of one or greater other features, integers, operations, elements, components, and/or portions thereof.

Unless otherwise defined, all terms including technical and scientific terms used herein have the same meaning as commonly understood by one of ordinary skill in the art to which this inventive concept belongs. It will be further understood that terms, such as those defined in commonly used dictionaries, should be interpreted as having a meaning that is consistent with their meaning in the context of the relevant art and will not be interpreted in an idealized or overly formal sense unless expressly so defined herein.

FIG. 1 is a cross-sectional view for illustrating a resistive switching element according to an embodiment of the present disclosure. Referring to FIG. 1, a resistive switching element 100 according to an embodiment of the present disclosure includes a first oxide layer 110, a second oxide layer 120, two-dimensional electron gas (2DEG) 130 and an active electrode 140.

The first oxide layer 110 and the second oxide layer 120 are stacked vertically to define an interface therebetween. The two-dimensional electron gas 130 may be present at the interface between the first oxide layer 110 and the second oxide layer 120.

The first oxide layer 110 and the second oxide layer 120 may be made of different metal oxides. Each of the first oxide layer 110 and the second oxide layer 120 may be made of a crystalline metal oxide or an amorphous metal oxide.

In one embodiment, each of the first oxide layer 110 and the second oxide layer 120 It may be made of an oxide including one metal element selected from a group consisting of titanium (Ti), zinc (Zn), aluminum (Al), hafnium (Hf), zirconium (Zr), tungsten (W), strontium (Sr), and the like. For example, each of the first oxide layer 110 and the second oxide layer 120 may be made of one metal oxide selected from a group consisting of a titanium oxide such as $TiO_2$, $SrTiO_3$, etc., a zinc oxide such as ZnO, etc., an aluminum oxide such as $Al_2O_3$, $LaAlO_3$, etc., a hafnium oxide such as HfO, a zirconium oxide such as ZrO, etc., a gallium oxide such as $Ga_2O_3$, a tungsten oxide such as $WO_x$, etc. In this case, the first oxide layer 110 and the second oxide layer 120 may be made of different materials. In one embodiment, the second oxide layer 120 which is positioned between the active electrode 140 and the two-dimensional electron gas 130 and in which a conductive filament is formed may be made of the aluminum oxide such as $Al_2O_3$, $LaAlO_3$, etc. or the tungsten oxide such as $WO_x$, etc., while the first oxide layer 110 may be made of the titanium oxide such as $TiO_2$ or $SrTiO_3$.

The two-dimensional electron gas 130 may be generated by confining electrons at a high density in the interface between the first oxide layer 110 and the second oxide layer 120. The electrons of the two-dimensional electron gas 130 may be prevented from moving out of the interface, but may freely move along and in the interface, thus exhibiting electrical conductivity properties.

In one example, when a thickness of each of the first oxide layer 110 and/or the second oxide layer 120 is smaller than about 2.5 nm, the two-dimensional electron gas 130 may not be generated. Thus, each of the first oxide layer 110 and the second oxide layer 120 may have a thickness greater than or equal to about 2.5 nm. For example, each of the first oxide layer 110 and the second oxide layer 120 may be formed to a thickness of about 5 to 500 nm.

The active electrode 140 may be disposed on the second oxide layer 120, and may be made of an electrically conductive metal material including copper (Cu) or silver (Ag). In an embodiment, the active electrode 140 may include an active metal layer disposed on the second oxide layer 120 and a buffer layer disposed between the active metal layer and the second oxide layer 120.

The active metal layer may be made of an active metal such as copper (Cu) or silver (Ag), and may provide active metal ions such as copper (Cu) ions and silver (Ag) ions into the second oxide layer 120 under a positive bias voltage application condition thereto.

The buffer layer may be made of titanium (Ti) and may prevent excessive active metal ions from moving from the active metal layer into the second oxide layer 120 under the positive bias voltage application condition thereto.

In the resistive switching element 100 according to the present disclosure, the two-dimensional electron gas 130 may function as an inactive electrode opposite to the active electrode 140. Therefore, when different voltages are respectively applied to the active electrode 140 and the two-dimensional electron gas 130 and thus a first electric field is generated therebetween, the active metal ions from the active electrode 140 may be injected into the second oxide layer 120 and then may move toward the two-dimensional electron gas 130. Then, the active metal ions may be reduced in a position adjacent to the two-dimensional electron gas 130 to form a conductive filament electrically connecting the active electrode 140 to the two-dimensional electron gas 130 inside the second oxide layer 120. When the conductive filament is formed inside the second oxide layer 120, the second oxide layer 120 becomes a low resistance state (LRS). In this case, a resistance of the filament is similar to that of the two-dimensional electron gas 130. For example, in the low resistance state (LRS), the resistance of the filament may be in a range of about 95% to 105% of the resistance of the two-dimensional electron gas 130.

In one example, when a second electric field of a direction opposite to that of the first electric field is generated between the active electrode 140 and the two-dimensional electron gas 130, the active metal ions may move in the opposite direction and thus the conductive filament may break near the two-dimensional electron gas 130. In this case, the second oxide layer 120 becomes a high resistance state (HRS).

Therefore, the resistive switching element 100 may switch the resistance state of the second oxide layer 120 based on the direction of the electric field generated between the active electrode 140 and the two-dimensional electron gas 130. Thus, the resistive switching element 100 may be applied to a memory element, a neuromorphic element, and the like, In a conventional resistive switching element, due to uncontrolled formation and destruction of the filament under repetitive electric field generation conditions, non-uniform resistive switching characteristics may occur in which a set voltage for switching the element from the high resistance state to the low resistance state and a reset voltage for switching the element from the low resistance state to the high resistance state are not constant. This problem is known to be mainly caused by formation of a relatively large filament inside a resistance-changing oxide layer.

However, the resistive switching element 100 according to the present disclosure uses the two-dimensional electron gas 130 as the inactive electrode, a relatively small filament may be formed inside the second oxide layer 120, and an extremely short tunnel gap (<0.5 nm) may be formed, thereby to improve controllability of filament formation and breakage. As a result, very uniform resistive switching characteristics may be realized. This will be described later.

Figure 2:
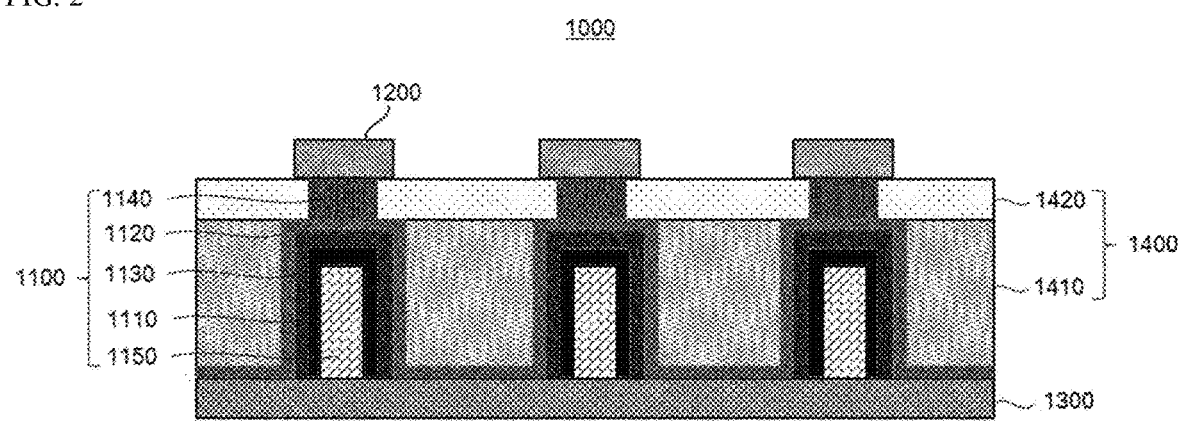
FIG. 2 is a cross-sectional view for illustrating a memory device according to an embodiment of the present disclosure.

FIG. 2 is a cross-sectional view for illustrating a memory device according to an embodiment of the present disclosure.

Referring to FIG. 2, a memory device 1000 according to an embodiment of the present disclosure includes a plurality of resistive switching elements 1100, a plurality of first signal lines 1200 and a plurality of second signal lines 1300.

The plurality of resistive switching elements 1100 may be arranged in a matrix of M×N in a first horizontal direction and a second horizontal direction orthogonal thereto.

Each of the plurality of resistive switching elements 1100 may include a first oxide layer 1110, a second oxide layer 1120, two-dimensional electron (2DEG) 1130, an active electrode 1140, and a support structure 1150.

The first oxide layer 1110, the second oxide layer 1120, the two-dimensional electron gas 1130 and the active electrode 1140 are substantially identical with the first oxide layer 110, the second oxide layer 120, the two-dimensional electron gas 130 and the active electrode 140 of the resistive switching element 100 as described with reference to FIG. 1, respectively, except for shapes thereof. Duplicate detailed descriptions thereof are omitted.

The support structure 1150 may have a columnar shape having a cross-sectional shape of a circle or a polygon, and may be disposed on the second signal lines. The support structure 1150 may have a columnar structure having a constant diameter or may have a columnar structure in which a diameter of a top face is different from a diameter of a bottom face. For example, the support structure 1150 may have a columnar structure having a circular or quadrangular cross-section, and having a constant diameter, or having a varying diameter in which a diameter of a top face thereof is smaller than a diameter of a bottom face thereof. The support structure 1150 may be made of an electrically insulating material. A material thereof is not particularly limited as long as the material has insulating properties.

The first oxide layer 1110 may be disposed to cover side and top faces of the support structure 1150. For example, the first oxide layer 1110 may be formed by forming a first oxide thin film having a predetermined thickness to cover the side and top faces of the support structure 1150 using an ALD process and then patterning the first oxide thin film. In addition, the second oxide layer 1120 may be disposed on the side and top faces of the support structure 1150 to directly cover the first oxide layer 1110. For example, the second oxide layer 1120 may be formed by forming the first oxide layer 1110 and then forming a second oxide thin film thereon using an ALD process.

When the first and second oxide layers 1110 and 1120 are formed such that an interface is formed therebetween as described above, the two-dimensional electron gas 1130 may be formed in the interface between the first and second oxide layers 1110 and 1120 as described above.

The plurality of first signal lines 1200 may be disposed on the plurality of resistive switching elements 1100, and may be electrically connected to the active electrodes 1140 of the plurality of resistive switching elements 1100.

In an embodiment, the plurality of first signal lines 1200 may be arranged to be spaced apart from each other in the second horizontal direction, while each of the first signal lines 1200 may extend along the first horizontal direction. Each of the first signal lines 1200 may be electrically connected to M active electrodes 1140 of M resistive switching elements 1100 arranged in a line along the first horizontal direction among the plurality of resistive switching elements 1100 and may apply a first voltage to the M active electrodes 1140 of the M resistive switching elements 1100.

The plurality of second signal lines 1300 may be disposed under the plurality of resistive switching elements 1100, and may be electrically connected to the two-dimensional electron gases 1130 of the plurality of resistive switching elements 1100. For example, each of the support structures 1150 of the resistive switching elements 1100 may be disposed on and supported on a corresponding second signal line 1300.

In an embodiment, the plurality of second signal lines 1300 may be arranged to be spaced apart from each other in the first horizontal direction, while each of the second signal lines 1300 may extend along the second horizontal direction. Each of the second signal lines 1300 may be electrically connected to N two-dimensional electron gases 1130 of N resistive switching elements 1100 arranged in a line along the second horizontal direction among the plurality of resistive switching elements 1100, and may apply a second voltage to the N two-dimensional electron gases 1130 of the N resistive switching elements 1100. For example, the second signal line 1300 may be in direct contact with an exposed bottom face of the two-dimensional electron gas 1130 and may be electrically connected to the two-dimensional electron gas 1130.

When the first and second voltages are respectively applied to the active electrode 1140 and the two-dimensional electron gas 1130 via the first and second signal lines 1200 and 1300, the electric field may be generated between the active electrode 1140 and the two-dimensional electron gas 1130, such that the second oxide layer 1120 may be subjected to the electric field. Thus, under this electric field, a conductive filament may be formed inside the second oxide layer 1120, for example, in a portion of the second oxide layer 1120 positioned above a top face of the support structure 1150 or the formed filament may be destroyed.

The memory device 1000 according to an embodiment of the present disclosure may further include a filling layer 1400 to improve structural stability.

The filling layer 1400 may be made of an electrically insulating material, and may fill a space between the resistive switching elements 1100 arranged in a matrix form of the M×N. Each of the active electrodes 1140 of the resistive switching elements 1100 may be exposed through a through-hole defined in a top portion of the filling layer 1400 and thus may be electrically connected to the first signal line 1200.

In an embodiment, the filling layer 1400 may include a first layer 1410 filling a space between the resistive switching elements 1100 and a second layer 1420 formed on the first layer.

The first layer 1410 may be formed to expose a portion of a top face of the second oxide layer 1120 of each of the resistive switching elements 1100 while filling the space between the resistive switching elements 1100. The second layer 1420 may be stacked on the first layer 1410, and may include a plurality of through-holes defined therein through which the active electrodes 1140 of the resistive switching elements 1100 may extend respectively. In one example, the first layer 1410 and the second layer 1420 may be made of the same insulating material or may be made of different insulating materials.

The memory device 1000 according to the present disclosure includes each of the resistive switching elements 1100 that include the two-dimensional electron gas 1130 generated between the first and second oxide layers 1110 and 1120 as the inactive electrode. Thus, a highly uniform resistive switching operation may be achieved. In addition, the memory device may exhibit excellent durability greater than or equal to about $10^7$ cycles, and may retain data for a time duration greater than or equal to $10^6$ s even under severe conditions of 85° C.

Hereinafter, examples of the present disclosure will be described in detail. However, the following examples are only some embodiments of the present disclosure, and the scope of the present disclosure is not limited to the following examples.

Present Example

A $TiO_2$ film with a thickness of about 20 nm was formed on a substrate using an ALD (atomic layer deposition) process at 250° C. In this case, titanium tetraisopropoxide (TiOCH $(CH_3)_{24}$) (TTIP) and water ($H_2O$) were used as sources of titanium and oxygen of the $TiO_2$ film, respectively.

Then, for generation of the two-dimensional electron gas (2DEG), an $Al_2O_3$ thin film with a thickness of about 7 nm was formed on the $TiO_2$ film using an ALD process at 250° C. At this time, trimethylaluminum ($Al(CH_3)_3$) (TMA) and water ($H_2O$) were used as sources of aluminum and oxygen of the $Al_2O_3$ thin film, respectively.

Then, the active electrode having a stack structure of a Ti (2 nm)/Cu (10 nm)/Pt (40 nm) and patterned into a rectangular shape was formed on the $Al_2O_3$ thin film using an E-beam deposition process and a photolithography process.

Then, an indium bottom contact in contact with the two-dimensional electron gas was formed using a soldering process. In this way, a resistive switching element according to an embodiment was manufactured.

Comparative Example

Platinum (Pt) was deposited on a substrate using vacuum deposition to form an inactive electrode thereon.

Then, an $Al_2O_3$ thin film with a thickness of about 7 nm was formed on the inactive electrode using the same ALD process as in the above Present Example.

Then, an active electrode having a stack structure of a Ti (2 nm)/Cu (10 nm)/Pt (40 nm) and patterned into a rectangular shape was formed on the $Al_2O_3$ thin film using the same E-beam deposition process and photolithography process as in the above Present Example. Thus, a resistive switching element according to Comparative Example was fabricated.

Experimental Example

Figure 3:
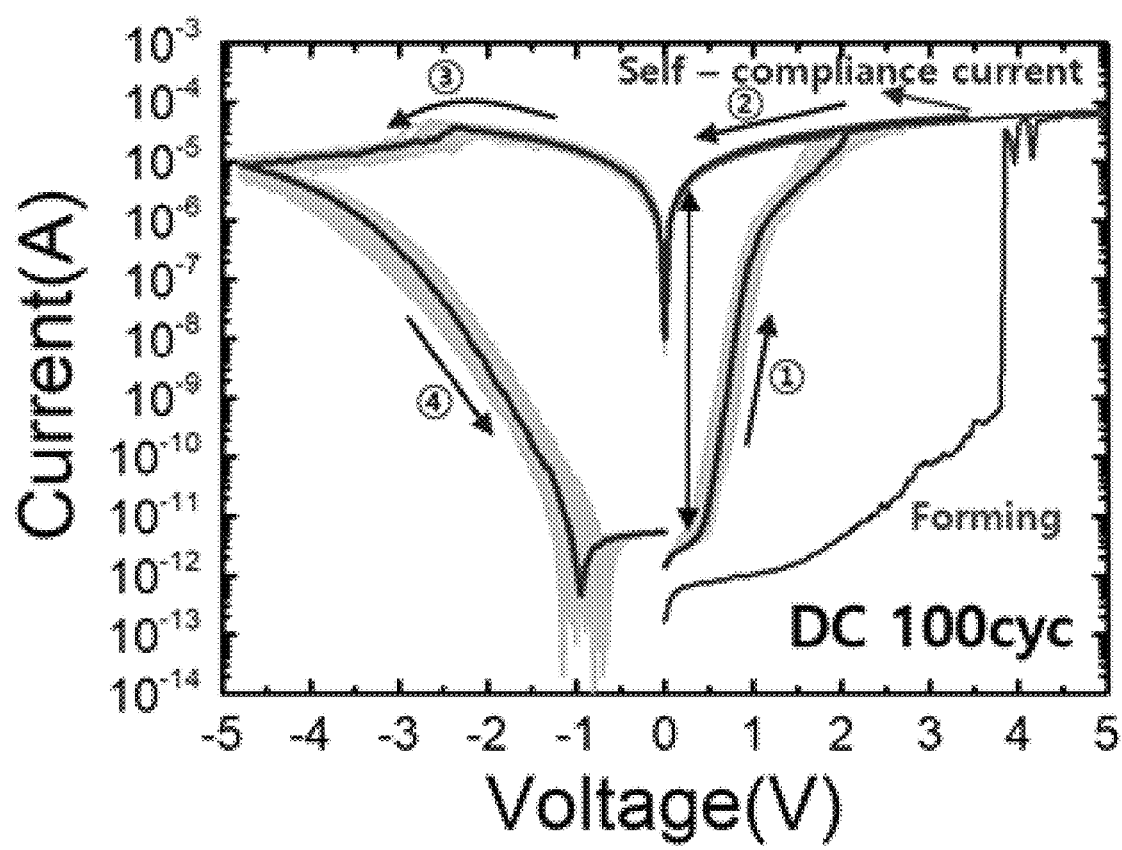
FIG. 3 shows I-V curves for 100 consecutive I-V sweeps performed on a resistive switching element according to Present Example without compliance current setting.

FIG. 3 shows I-V curves for 100 consecutive I-V sweeps performed on a resistive switching element according to Present Example without compliance current setting. In FIG. 3, a red curve represents a representative I-V curve for 100 consecutive I-V sweeps, and gray curves represent remaining 99 I-V curves, and a blue curve represents a forming process. An inset of FIG. 3 is a graph showing a resistance value based on a temperature measured in a set state of the resistive switching element according to Present Example.

First, referring to the inset of FIG. 3, it may be identified that a filament formed in the $Al_2O_3$ thin film is made of Cu. Specifically, general dependence of metal resistance on the temperature is expressed by Equation 1 below.

$$R(T)=R_0[1+\alpha(T-T_0)]$$ [Equation 1]

In the Equation 1, R(T) represents a resistance at a temperature T, $R_0$ represents a resistance at room temperature To, and $\alpha$ represents a resistance constant related to a temperature.

The measured $\alpha$ at a read voltage of 2 V was $2.25\times10^{-3}$ $K^{-1}$, which is substantially equal to a previously reported value for a Cu nanowire of about $2\times10^{-3}$ $K^{-1}$. Thus, it may be proven that the filament is made of copper (Cu).

In one example, referring to FIG. 3, it may be identified that the resistive switching element according to Present Example exhibits a highly uniform IV curve for 100 consecutive IV sweeps, compared to any previously reported element using Cu ion migration.

Further, in the resistive switching element according to Present Example, there is little deviation of low resistance states in a process of the 100 consecutive I-V sweeps. In a first sweep after the forming process, the current is relatively gradually increased according to the positive bias application. This is due to resistance of the two-dimensional electron gas connected in series with the filament.

It may be identified that although a size of the active electrode is relatively large (150 μm×150 μm), the resistive switching element according to Present Example exhibits uniform resistive switching characteristics for repeated cycles. When a size of the active electrode is reduced to 10 μm×10 μm, the element exhibits the same uniform resistive switching characteristics.

In one example, it may be identified that an on/off current ratio at a read voltage of 0.2V is about $10^6$ and thus is high. Further, reset (switching from LRS to HRS) occurs at a negative bias of about −3V. A reset voltage is higher than a set voltage. This is due to depletion of the two-dimensional electron gas under the negative bias application condition.

Figure 4:
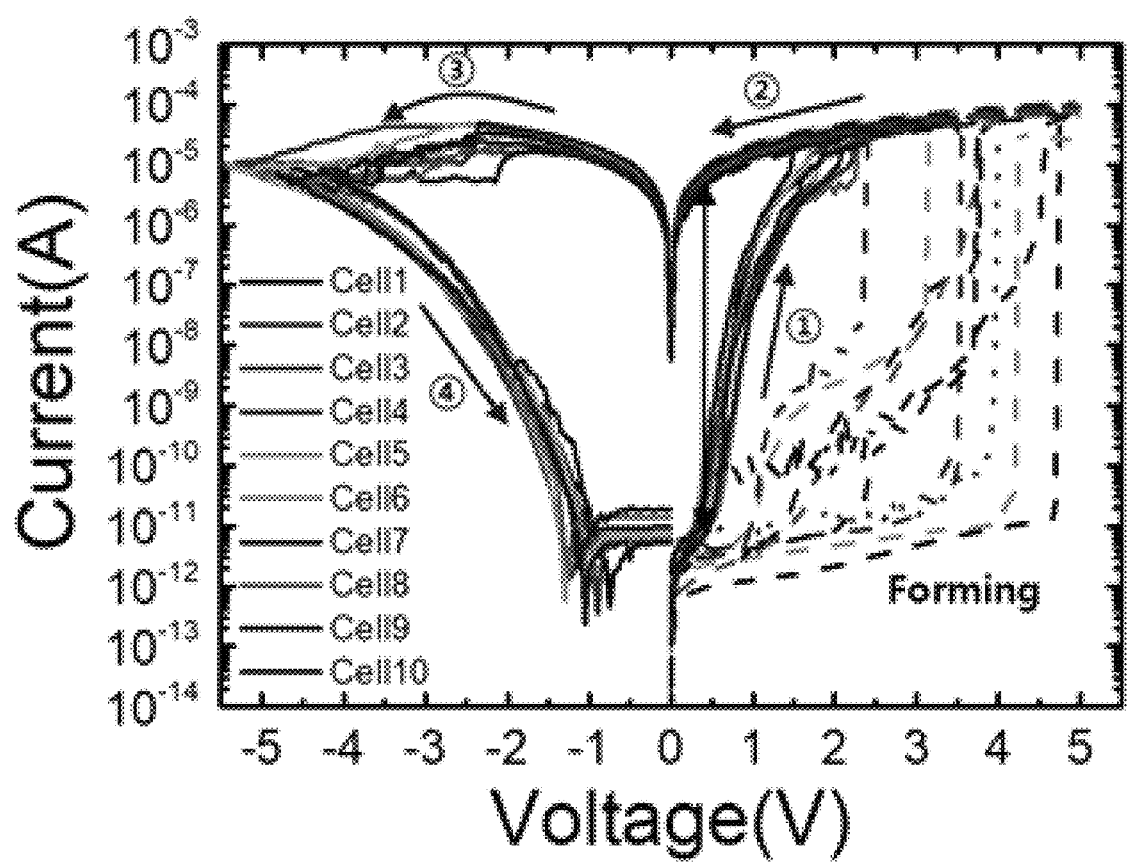
FIG. 4 shows I-V curves for I-V sweeps performed on ten resistive switching elements fabricated according to Present Example.

FIG. 4 shows I-V curves for I-V sweeps performed on ten resistive switching elements fabricated according to Present Example.

In a resistance-based memory, it is very important to reduce cell-to-cell variation in resistive switching characteristics for reliable operation of the memory. However, when forming voltages for initially forming the filament in different cells are different from each other, different resistances may be induced in the different cells due to the difference between the forming voltages of the different cells. This ultimately causes failure of the memory operation.

However, referring to FIG. 4, it may be identified that although the 10 different resistive switching elements manufactured according to Present Example have different forming voltages in a range of 1 to 5V, resistance values in the set state of the 10 resistive switching elements are similar to each other, and as a result, uniform switching behavior is achieved. Specifically, a resistance state of each resistive switching element became constant after a set process (switching from HRS to LRS) because the element follows a second sweep mode (②) in FIG. 4) due to the two-dimensional electron gas.

This is because the two-dimensional electron gas is connected in series to the Cu filament, so the resistance values in the set state are uniform as the resistance value of the two-dimensional electron gas. Specifically, as the Cu filament grows, the resistance of the Cu filament decreases, so that the resistance of the two-dimensional electron gas connected in series thereto becomes greater than that of the Cu filament. Thus, the bias is concentrated on the two-dimensional electron gas, and as a result, the migration of additional Cu ions is suppressed. Therefore, the resistance of each resistive switching element is tuned to the resistance of the two-dimensional electron gas leading to the superposition of the set behaviors. The two-dimensional electron gas in the $Al_2O_3/TiO_2$ interface is measured to have an electron density of about $10^{14}/cm^2$, an electron mobility of about 3 $cm^2/Vs$, and a surface resistance of about 20 k$\Omega$.

The self-adjusting resistance characteristic after the set process may allow the memory cells to overcome the non-controlled cell resistance after the forming process which is a serious obstacle to the development of next-generation non-volatile memory.

Figure 5:
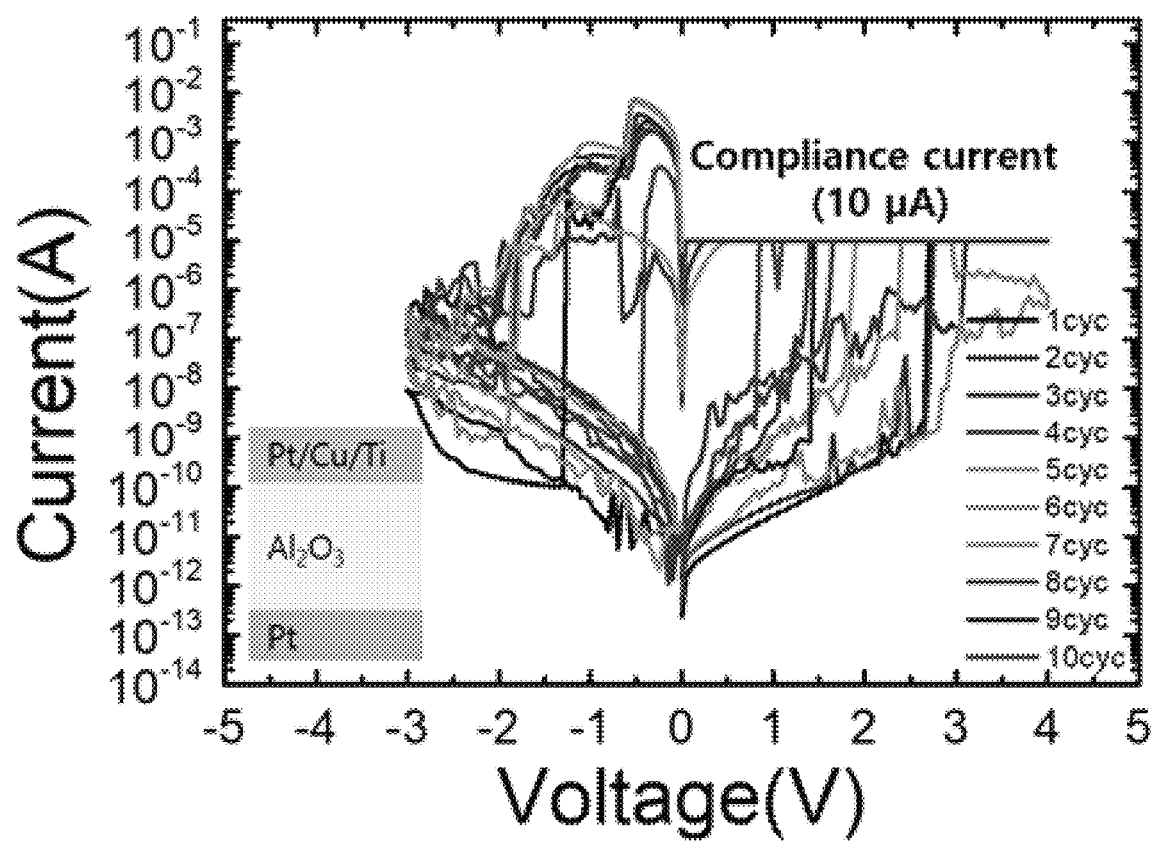
FIG. 5 shows I-V curves for 10 successive I-V sweeps performed on a resistive switching element according to Comparative Example with a compliance current being set to 10 µA.

FIG. 5 shows a I-V curve for 10 successive I-V sweeps performed on a resistive switching element according to Comparative Example with a compliance current being set to 10 μA.

Referring to FIG. 5, the resistive switching element according to the Comparative Example exhibits non-uniform I-V characteristics, compared with the resistive switching element according to Present Example. This is because a substantial portion of the filament is destroyed during the reset process under a Joule heating process under the negative bias application condition. This causes a large tunnel gap in the high resistance state (HRS) and large resistance deviation in the low resistance state (LRS) during a subsequent set process that affects a resistance and a shape of the filament. In an operation of a conventional resistive switching element, this is a typical problem. The formation of the large filament and the aggressive destruction thereof under the subsequent Joule heating process causes large variations in the filament resistance and shape.

In one example, a current level in the set state of the resistive switching element according to Present Example is found to be in a range of 10 μA, which is lower than a current level in the set state of the resistive switching element according to the Comparative Example. This is because when the two-dimensional electron gas acts as the inactive electrode, a smaller filament is formed.

In conclusion, when the two-dimensional electron gas acts as the inactive electrode, the destruction of the filament under the Joule heating may be minimized. The reset process is dominated by the migration of Cu ions under the negative bias application condition, rather than by the Joule heating. When the Joule heating effect is dominant in the reset process, the reset process will experience a sharp change in current under the bias application condition.

In this connection, as shown in a process ③ of FIG. 3, when the two-dimensional electron gas acts as the inactive electrode, the current decreases more gradually, and the current level is about $10^{-5}$ A, which is significantly lower than the previously reported current level of about $10^{-3}$ A. The Joule heating effect is proportional to a square of the current. Thus, according to the present disclosure in which the two-dimensional electron gas acts as the inactive electrode, the Joule heating effect may be minimized due to a lower current level.

Figure 6:
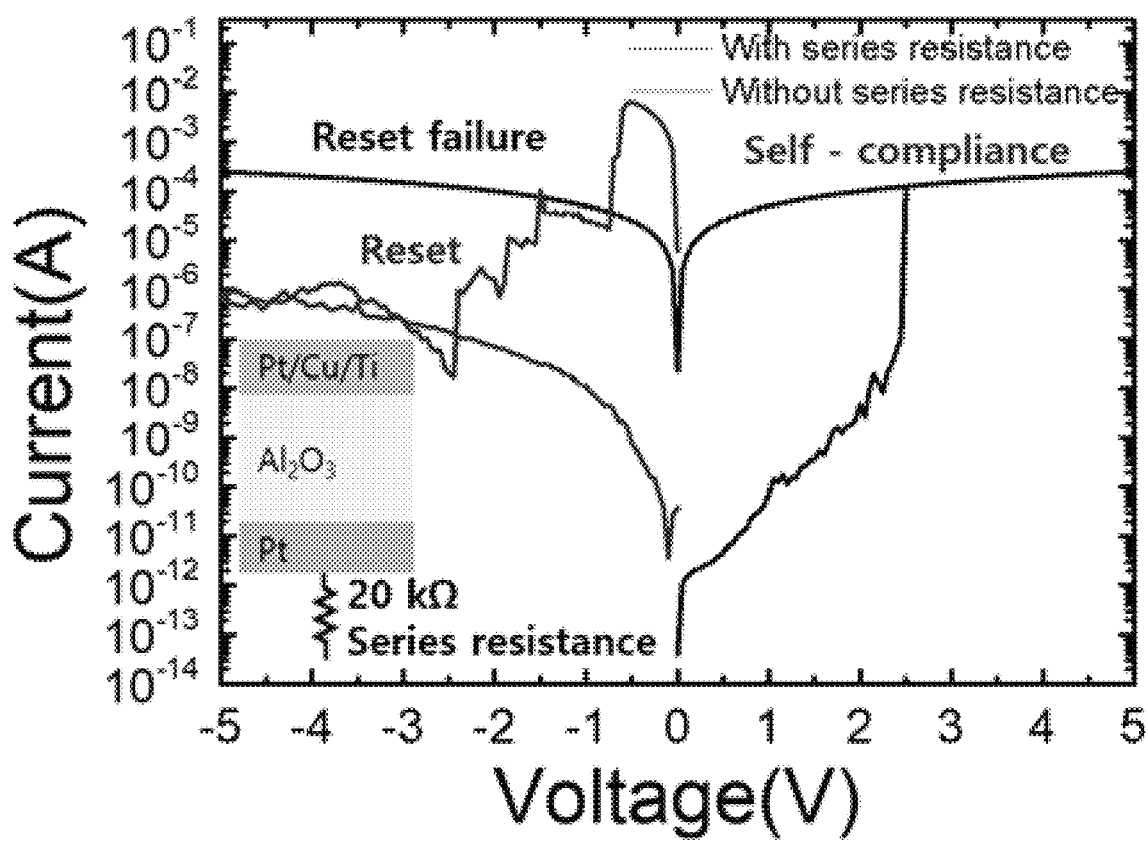
FIG. 6 shows a I-V curve measured in each of a case when an external resistor is connected in series to a resistive switching element according to Comparative Example and a case when the external resistor is not connected to the resistive switching element according to Comparative Example.

FIG. 6 shows a I-V curve measured in each of a case when an external resistor is connected in series to a resistive switching element according to Comparative Example and a case when the external resistor is not connected to the resistive switching element according to Comparative Example.

Referring to FIG. 6, when the two-dimensional electron gas acts merely as a series resistor, the resistive switching element according to the Comparative Example connected in series to an external resistor of 20 k$\Omega$ should exhibit the same I-V characteristics in repeated measurements as in the resistive switching element according to Present Example. However, as shown in an inset of FIG. 6, when the external resistor of 20 k$\Omega$ is connected in series to the inactive electrode, a self-compliance current characteristic is achieved. However, after the set process, the cell fails to return to the high resistance state (HRS) (that is, reset failure). This is because a size of the filament is large that the filament is not destroyed under the negative bias application condition, and Joule heating is dominant in the reset process.

Thus, it may be identified that when the two-dimensional electron gas acts as the inactive electrode, the two-dimensional electron gas plays an important role for the formation of the smaller filament.

Figure 7A:
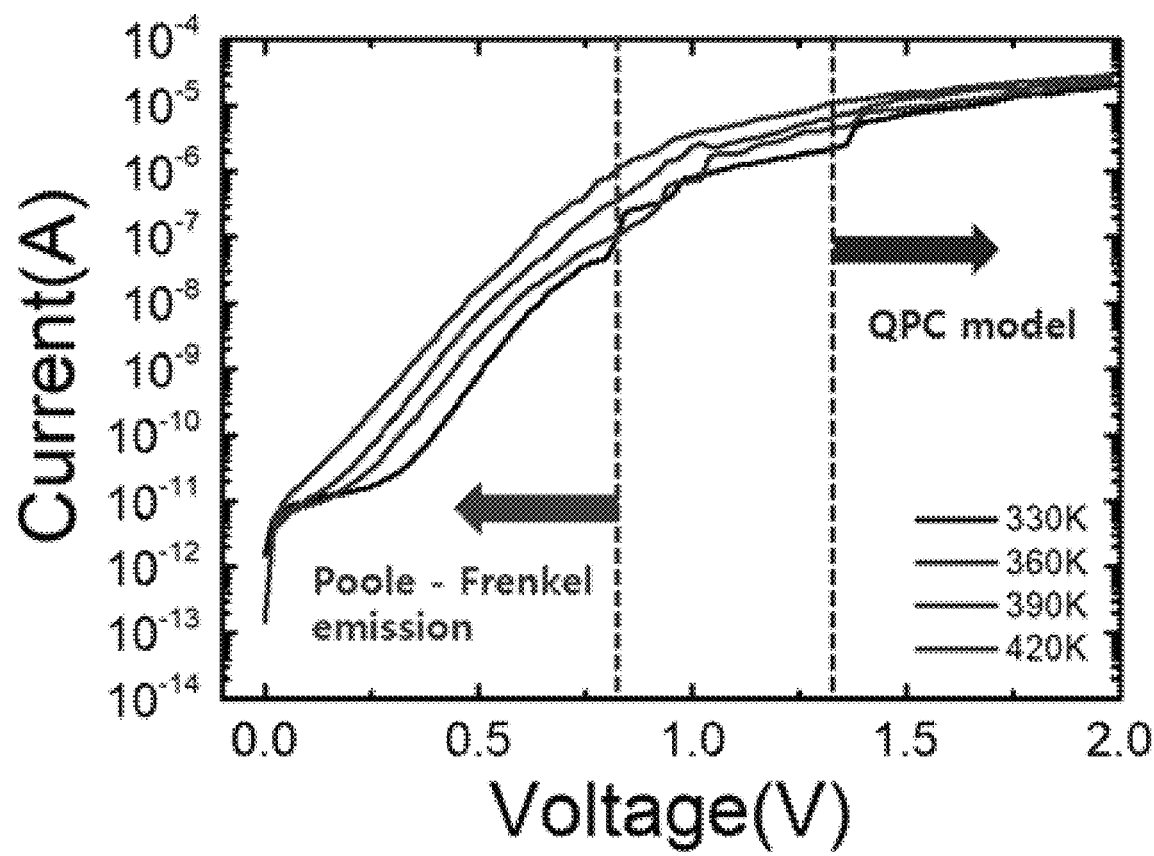
FIGS. 7A to 7C show I-V curves based on a temperature of a resistive switching element according to Present Example.
Figure 7B:
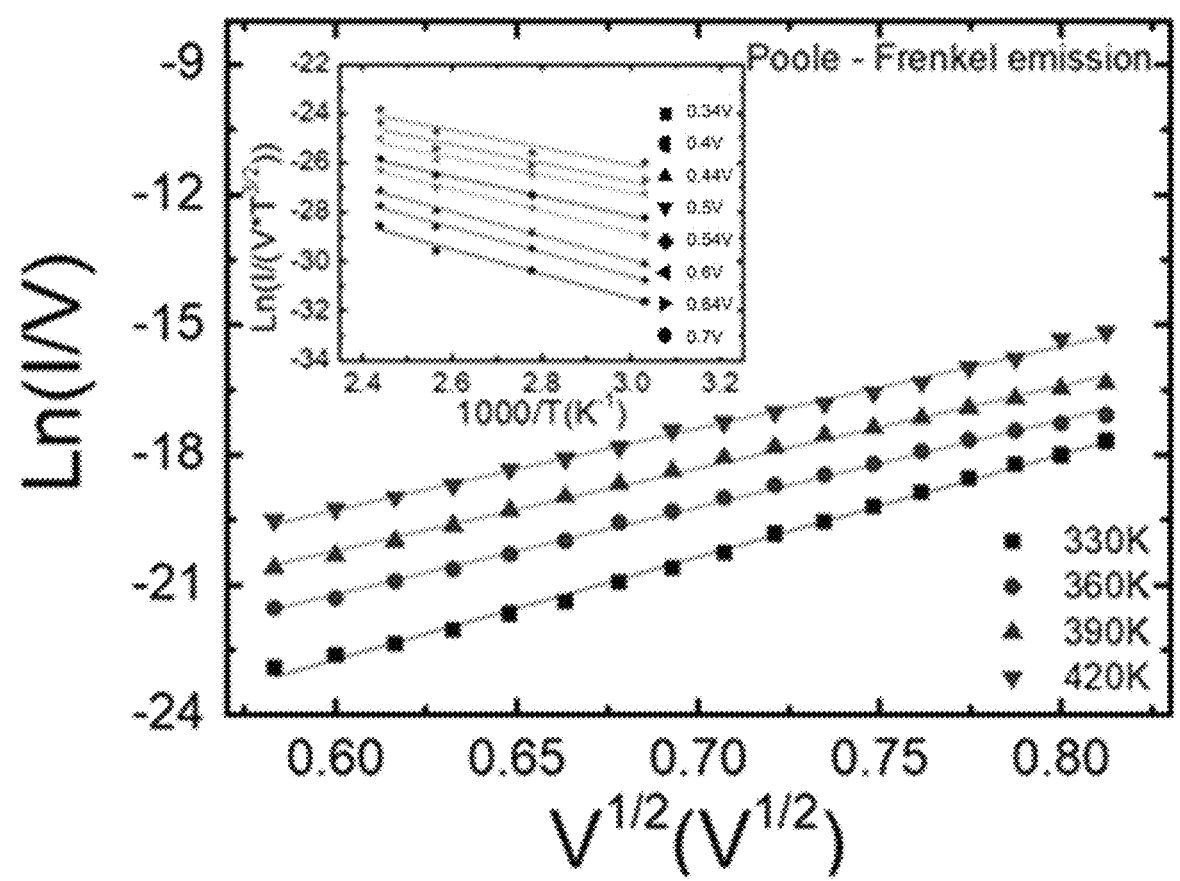
Figure 7C:
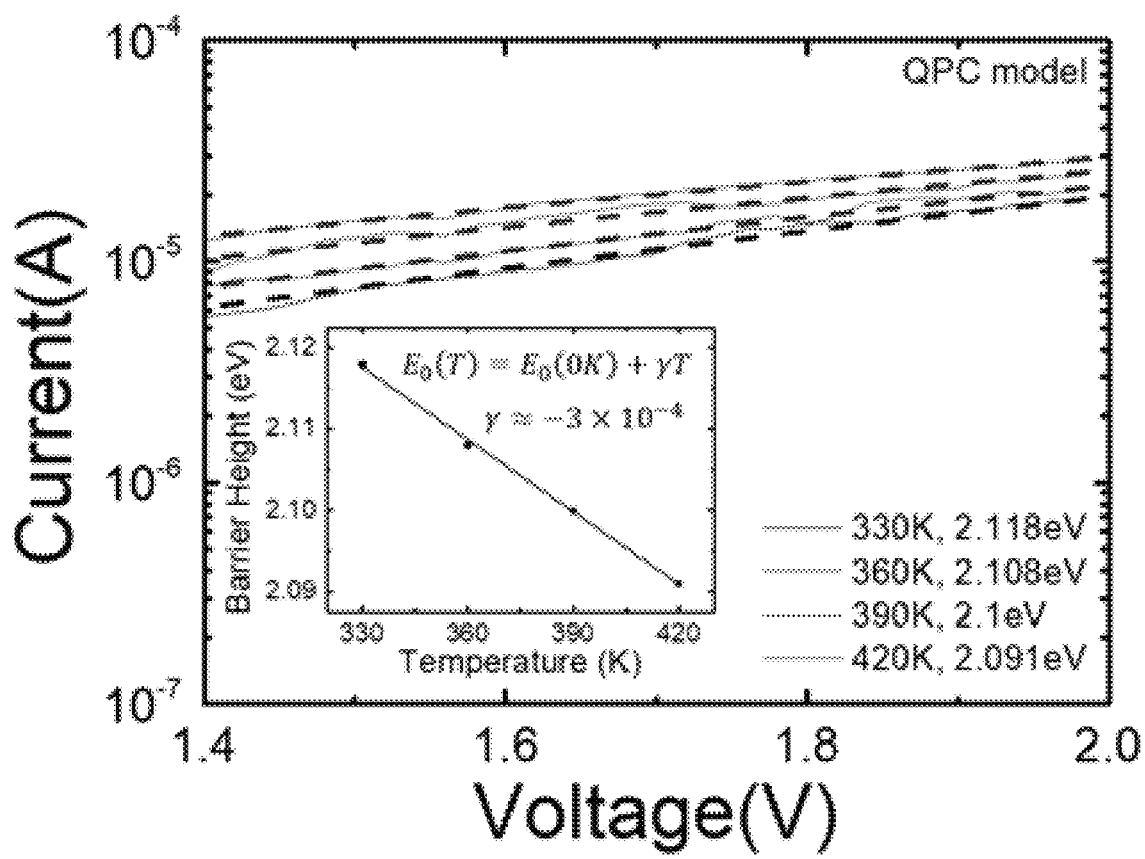
Figure 7D:
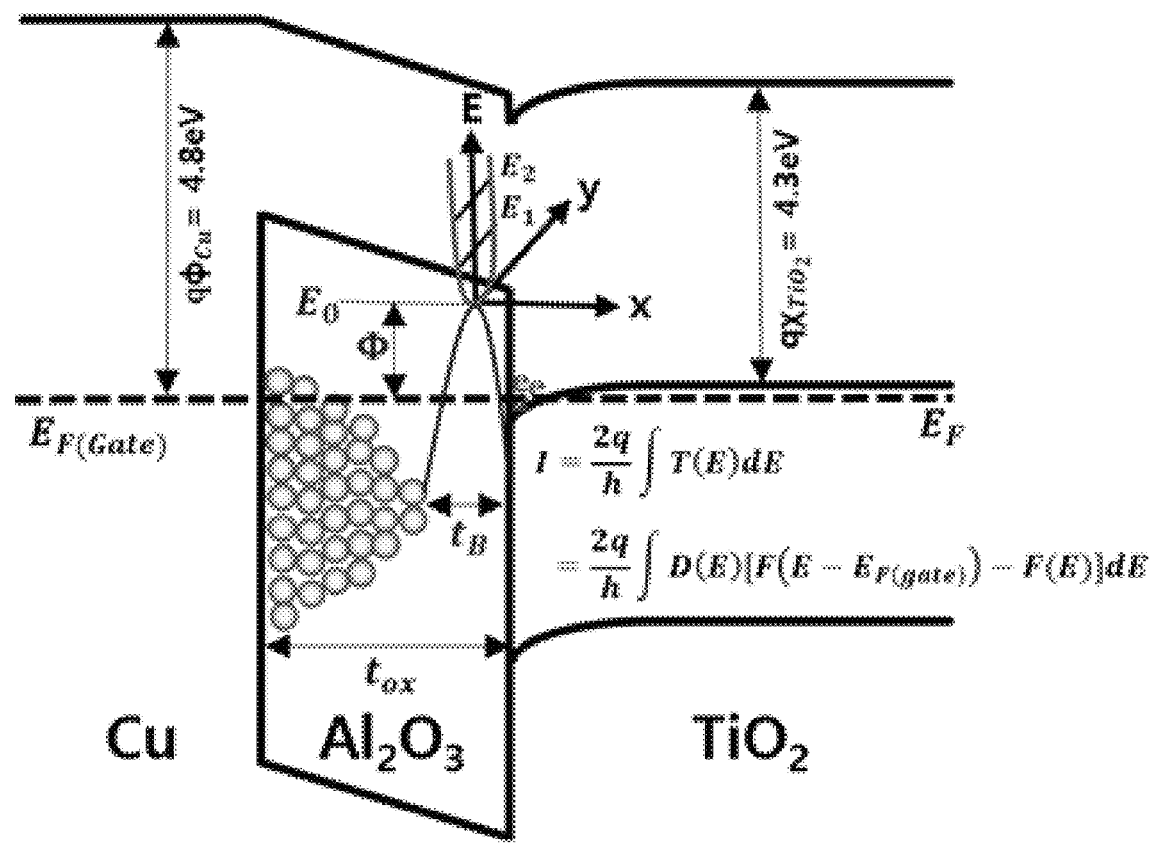
FIG. 7D shows an energy band diagram of the resistive switching element according to Present Example.

FIGS. 7A to 7C show I-V curves based on a temperature of a resistive switching element according to Present Example, and FIG. 7D shows an energy band diagram of the resistive switching element according to Present Example.

As shown in FIG. 7A, under a low bias (<1V) condition, the current is controlled under a P-F (Poole-Frankel) emission model. Under a relatively higher bias (>1.3V) condition, the current is controlled under a QPC (quantum point contact) model.

Specifically, as shown in FIG. 7B, the I-V curves comply with the P-F emission model at voltages lower than 0.8V. However, as shown in FIG. 7C, when the set process occurs at a voltage higher than or equal to 1.3V, the I-V curves comply with the QPC model.

The QPC model is applied to a very narrow conducting filament and accounts for a conduction mechanism between discrete metal islands. Because the filament is narrow enough to behave as a quasi 1-D system of electronic states, it is assumed that it has a 1-D parabolic potential. The QPC model accounts for the I-V curve in the high resistance state (HRS). This accounts for an atomic-level tunnel gap at a filament end.

To prove whether the QPC model complies with the resistive switching element according to Present Example, the I-V curve is simulated using Equation 2 and the simulation result is compared with an experimental result.

$$I(V) = \frac{2e}{h}NeV + \frac{1}{\alpha}\text{Ln}\left[\frac{1+\exp\alpha[\phi - \beta eV]}{1+\exp\alpha[\phi + (1-\beta)eV]}\right] \quad \text{[Equation 2]}$$

In the above Equation 2, e and h represent an electronic charge and a Planck constant, respectively, N represents the number of Cu filaments, $\Phi$ represents a barrier height, and $\alpha$ is equal to $t_B^{-2}h^{-1}\sqrt{2m^*/\phi}$, where $t_B$ and $m^*$ represent the tunnel gap and the effective electron mass of Cu, respectively. It is assumed that when N=1, $t_B$ is 0.3 nm based on a best fitting in FIG. 7C. $m^*$ is 1.01 $m_0$. Thus, $\alpha$ may be defined as a function of $\Phi$, and $\beta$ refers to a fraction of a filament length in the oxide and is close to 1. Generally, I (V) may be expressed based on a function of the barrier height $\Phi$ extracted from the I-V curves (FIG. 7C) experimentally obtained at different temperatures. The barrier height is calculated to be in a range of 2.09 to 2.12 eV in a range of 330 to 420 K. The calculation result is consistent with an energy band structure, as shown in FIG. 7D. A dependence of the barrier height on the temperature may be expressed based on Equation "$\phi(T)=\phi_0+\gamma T$", where $\gamma$ is reported to be in a range of $-10^{-4}$ to $-10^{-3}$ eV/K. Based on an inset of FIG. 7C, the $\gamma$ value is calculated as $-3\times10^{-4}$ eV/K, which is similar to a reported value. An energy band diagram corresponding to the resistive switching element according to Present Example may be described using a QPC model as shown in FIG. 7D.

Figure 8A:
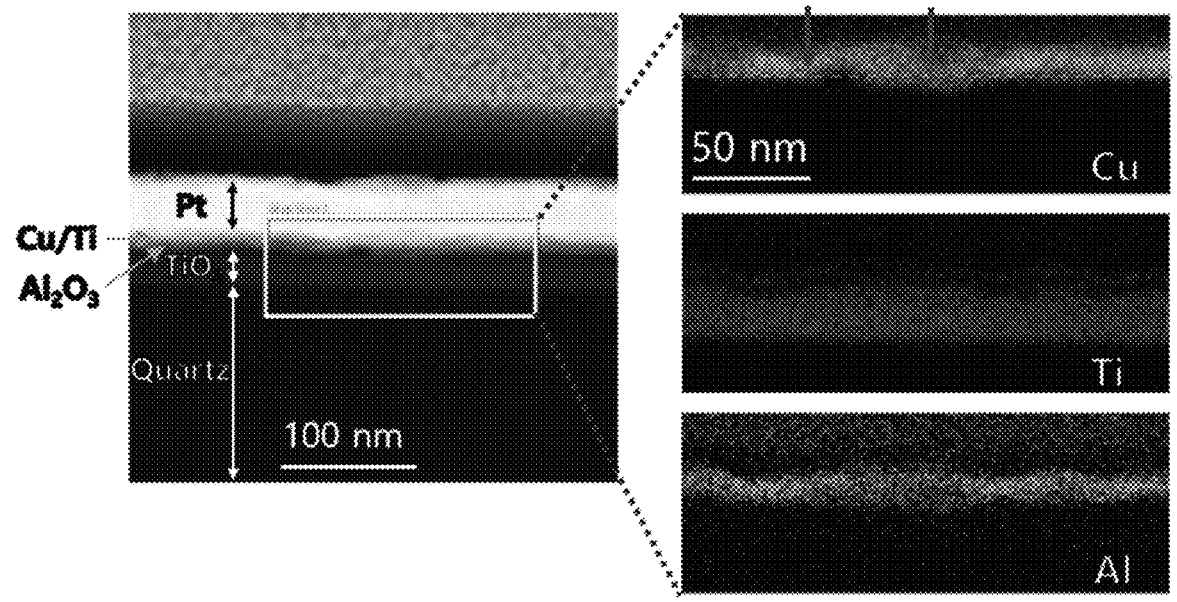
FIG. 8A shows a cross-sectional TEM image having an EDX mapping result of Cu, Ti and Al in a set state of a resistive switching element according to Present Example.
Figure 8B:
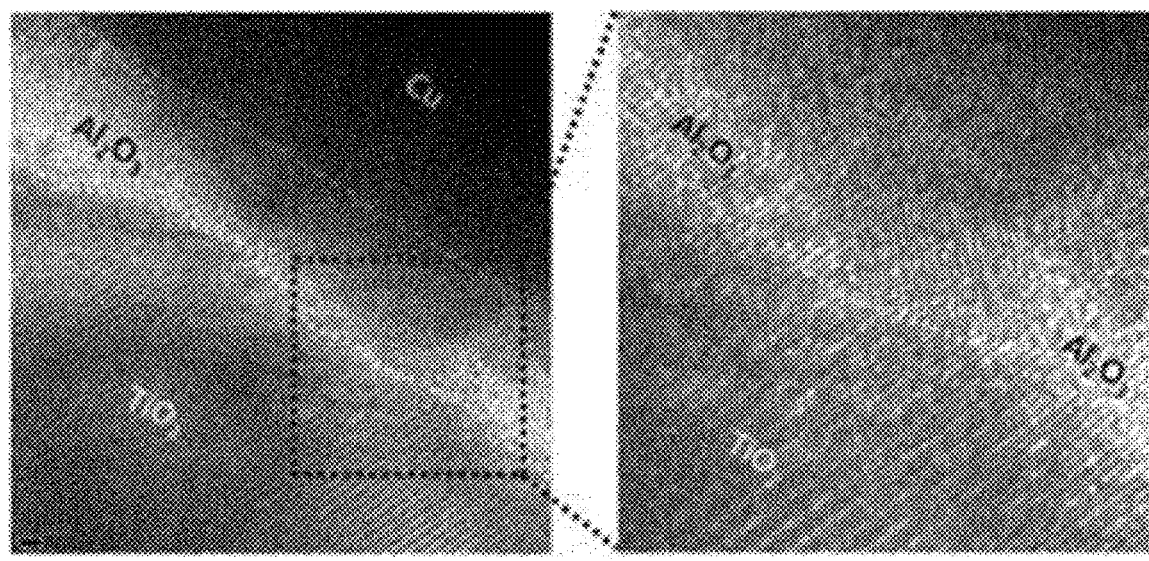
FIG. 8B is a high-magnification TEM image near an interface between $Al_2O_3$ and $TiO_2$ layers of a resistive switching element according to Present Example.

FIG. 8A shows a cross-sectional TEM image having an EDX mapping result of Cu, Ti and Al in a set state of a resistive switching element according to Present Example, and FIG. 8B is a high-magnification TEM image near an interface between $Al_2O_3$ and $TiO_2$ layers of a resistive switching element according to Present Example.

Even when the $Al_2O_3$ film is used as solid electrolyte, a shape of the filament is still a matter of debate. It has been reported that the diffusivity of metal ions and electrochemical reaction kinetics in the inactive electrode determine the shape of the filament. Experimentally, a conical filament which is tapered as it extends toward to the Cu active electrode has been reported. Conversely, a filament shape that is tapered as it extends toward the inactive electrode has also been reported. The formation of the filament which is tapered toward the active electrode is thought to be due to the rapid reduction kinetics of metal ions in the inactive electrode and the high diffusivity of metal ions through the solid electrolyte. On the other hand, the formation of the filament that is tapered toward the inactive electrode is considered to be due to the slow reduction kinetics at the inactive electrode, and the low diffusivity of metal ions in the solid electrolyte, and a short movement distance of Cu ions.

Referring to FIG. 8A and FIG. 8B, in the resistive switching element according to Present Example, the filament in a region closer to the two-dimensional electron gas as the inactive electrode is extremely small to have a diameter of several nm, whereas an upper portion of the filament closer to the active electrode is found to be as large as previously reported.

As shown in FIG. 8A, the EDX mapping analysis of Cu, Ti and Al elements supports the migration of Cu elements towards the $Al_2O_3/TiO_2$ layers. A region where the Cu migration is prominent is indicated by a red arrow, and lower restriction of Cu element before migration is indicated by a yellow guide line. The upper portion of the filament is formed during the forming process, and a lower portion of the filament near the two-dimensional electron gas is changed during the set/reset processes.

As shown in FIG. 8B, a size of the Cu filament is much smaller than a corresponding upper portion, and as a result, only the lower portion of the filament has changed during the set/reset processes, resulting in the highly uniform set/reset processes for repeated IV sweeps.

In order to form the small filament, the reduction rate of Cu ions in the inactive electrode needs to be sufficiently slow, and the reduction rate of Cu ions at the $Al_2O_3/TiO_2$ heterostructure interface is much slower than that of noble metal such as Pt. Because the two-dimensional electron gas at the $Al_2O_3/TiO_2$ heterostructure interface exhibits semi-metallic electrical conductivity, the ability for the dimensional electron gas to supply electrons to Cu ions will be weaker than that of the noble metal Pt. Therefore, when the two-dimensional electron gas at the $Al_2O_3/TiO_2$ heterostructure interface acts as the inactive electrode, an extremely small filament may be formed near the inactive electrode.

Further, a concentration of Cu or Ag ions near the inactive electrode decreases as a work function of the inactive electrode decreases. $Al_2O_3/TiO_2$ exhibits a work function as low as 4.3 eV. Thus, when the two-dimensional electron gas at the $Al_2O_3/TiO_2$ heterostructure interface acts as the inactive electrode, this may induce a lower Cu ion concentration at the inactive electrode and, as a result, an extremely small Cu filament near the inactive electrode may be formed.

Therefore, the shapes of the Cu filament in the set and reset states have been proposed. In addition to the TEM analysis, the resistance in the low resistance state (LRS) is constant even when an area of the active electrode as the upper electrode decreases, while the resistance in the high resistance state (HRS) decreases as an area of an upper electrode decrease in the reset state. Thus, the conductivity of the current in the set state is dominated by the filament conductivity.

Figure 9:
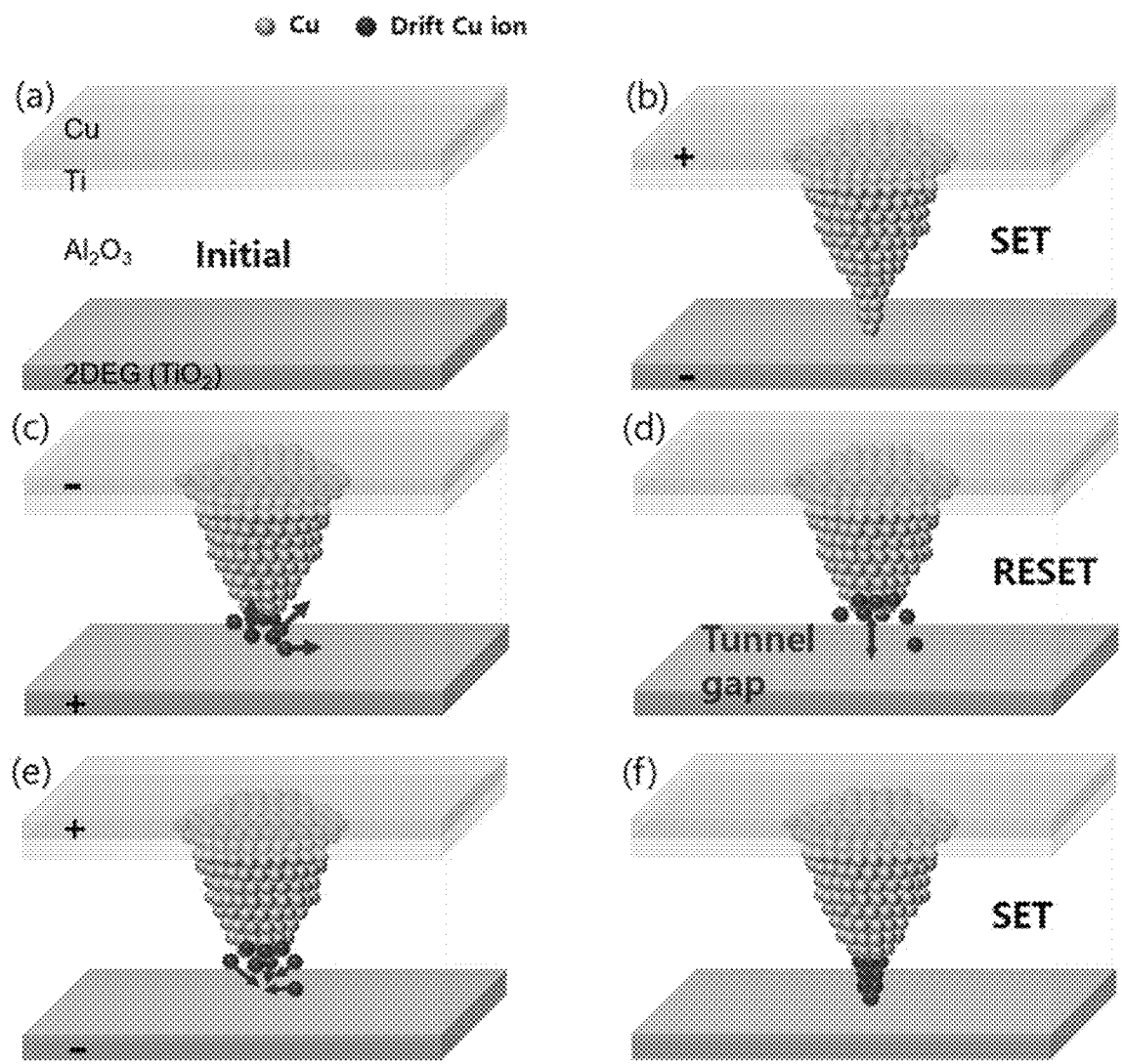
FIG. 9 is a diagram for illustrating formation and destruction of a filament in set and reset states, and a shape of the filament in a resistive switching element according to Present Example.

FIG. 9 is a diagram for illustrating formation and destruction of a filament in set and reset states, and a shape of the filament in a resistive switching element according to Present Example. In FIG. 9, (a) represents an initial state of the resistive switching element, (b) represents the set state when a positive voltage is applied to the upper electrode Cu/Ti, (c) and (d) represent the reset state after a negative voltage is applied to the upper electrode Cu/Ti, and (e) and (f) represent the set state when a positive voltage is applied to the upper electrode Cu/Ti again after the reset.

Referring to FIG. 9, in the set state, due to the low work function of the two-dimensional electron gas at the $Al_2O_3/TiO_2$ interface, a filament with a large diameter near the upper electrode and an extremely small diameter near the two-dimensional electron gas is formed.

Due to the shape of the filament with a very small diameter in the vicinity of the two-dimensional electron gas, the electric field is concentrated on a tip of the small filament in the vicinity of the two-dimensional electron gas under the negative voltage application condition. Most of Cu ions in this portion have moved from the two-dimensional electron gas to the upper Cu/Ti electrode. This causes the destruction of the Cu filament in a narrow portion thereof near the inactive electrode, and the reset state with a very small tunnel gap is achieved.

When a positive voltage is applied to the upper electrode again, Cu ions move to the two-dimensional electron gas, and as a result, the set state is restored.

In conclusion, the formation and destruction of the Cu filament occurs near the two-dimensional electron gas rather than in an entirety of the filament. This causes uniform resistive switching over repeated cycles.

It is assumed that, based on the TEM analysis and the QPC model, in the resistive switching element according to Present Example, the filament near the two-dimensional electron gas is composed of only a few Cu atoms. A total resistance of the resistive switching element may be assumed as a function of $R_{Fila}$ (Cu filament resistance), $R_{tunnel}$ (tunnel gap resistance), $R_{OX}$ ($Al_2O_3$ resistance) and $R_{2DGE}$ (2DEG resistance) as described in Equation 3 below.

$$R_{total,LRS} = \frac{R_{fila,LRS} \times R_{ox}}{R_{fila,LRS} \times R_{ox}} + R_{2DEG} \approx R_{fila,LRS} + R_{2DEG} \quad \text{[Equation 3]}$$

Figure 10A:
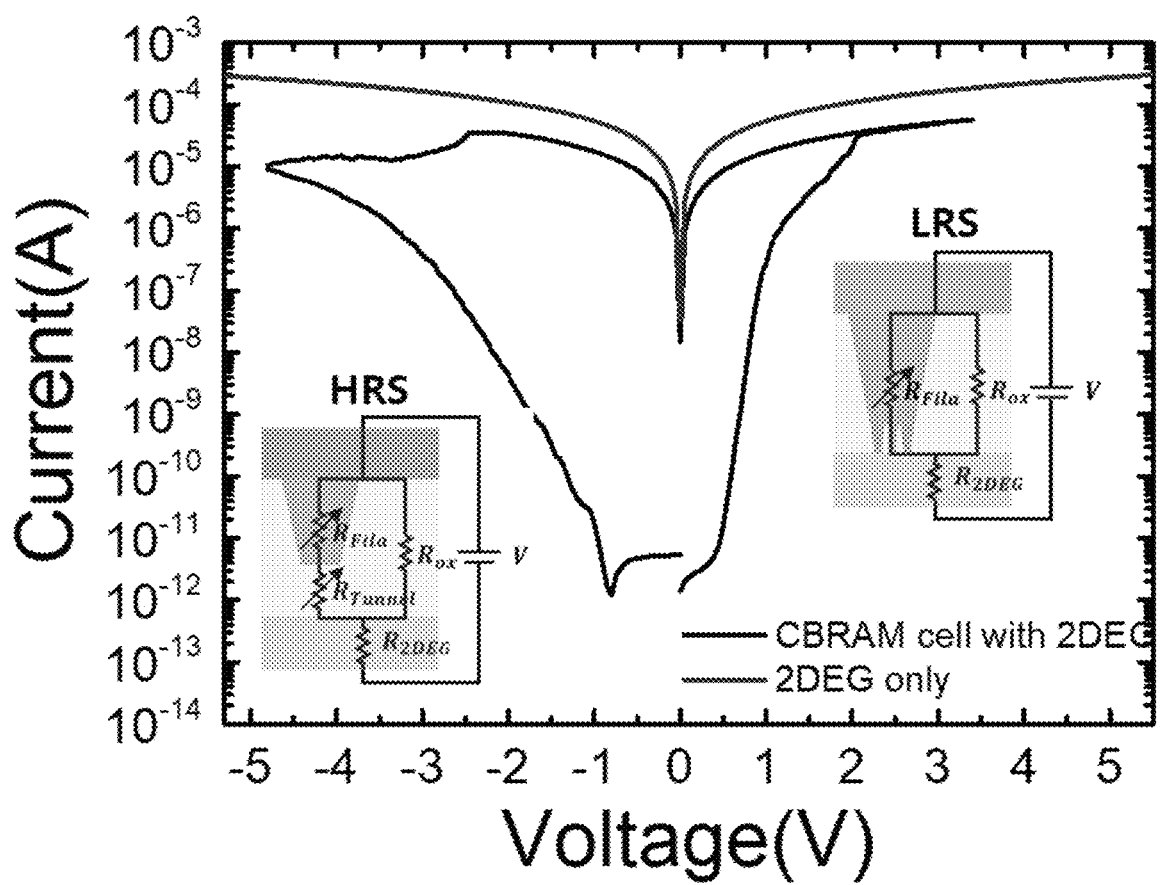
FIG. 10A shows a I-V curve after 100 successive voltage sweeps on a resistive switching element according to Present Example.
Figure 10B:
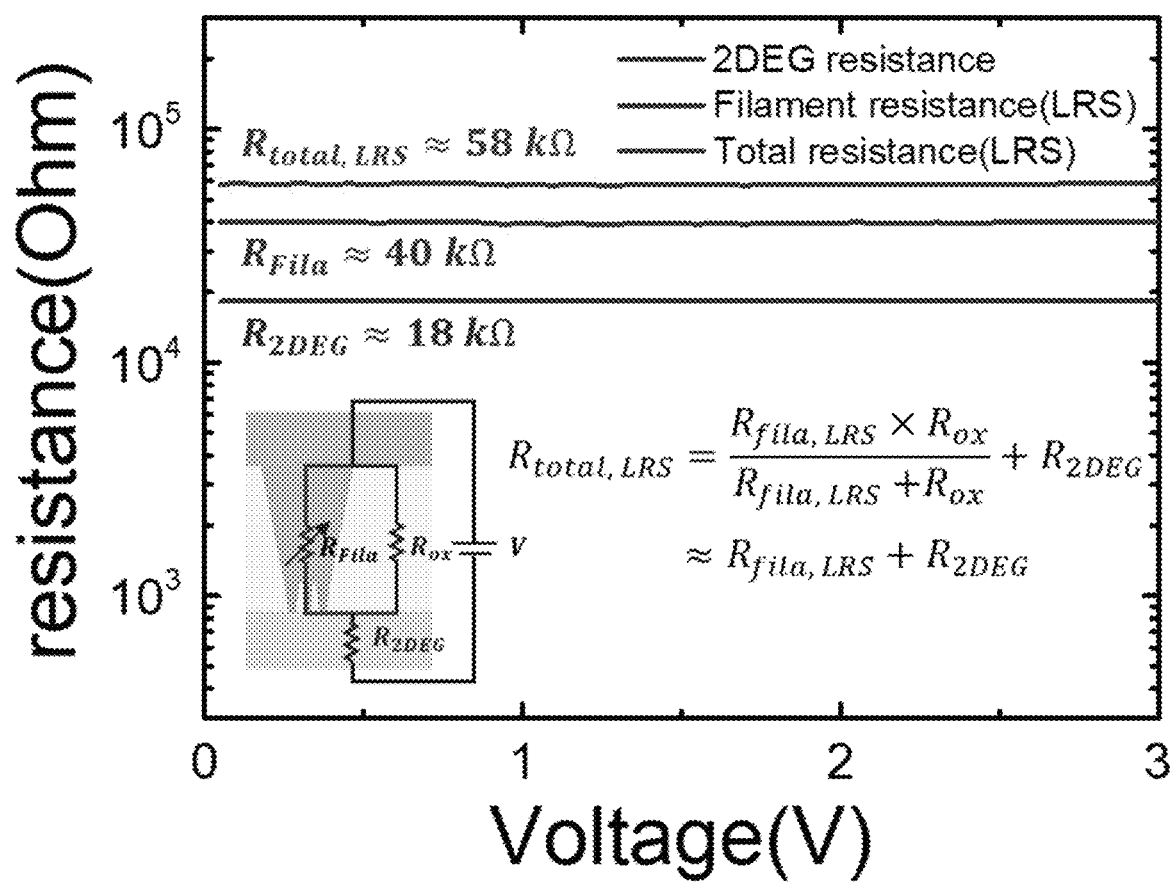
FIG. 10B shows $R_{Fila}$ (Cu filament resistance), $R_{tunnel}$ (tunnel gap resistance), $R_{OX}$ ($Al_2O_3$ resistance) and $R_{2DGE}$ (2DEG resistance) as extracted from the I-V curve of FIG. 10A, and FIG. 10C and FIG. 10D show calculation results of an effective potential applied to the resistive switching element according to Present Example.
Figure 10C:
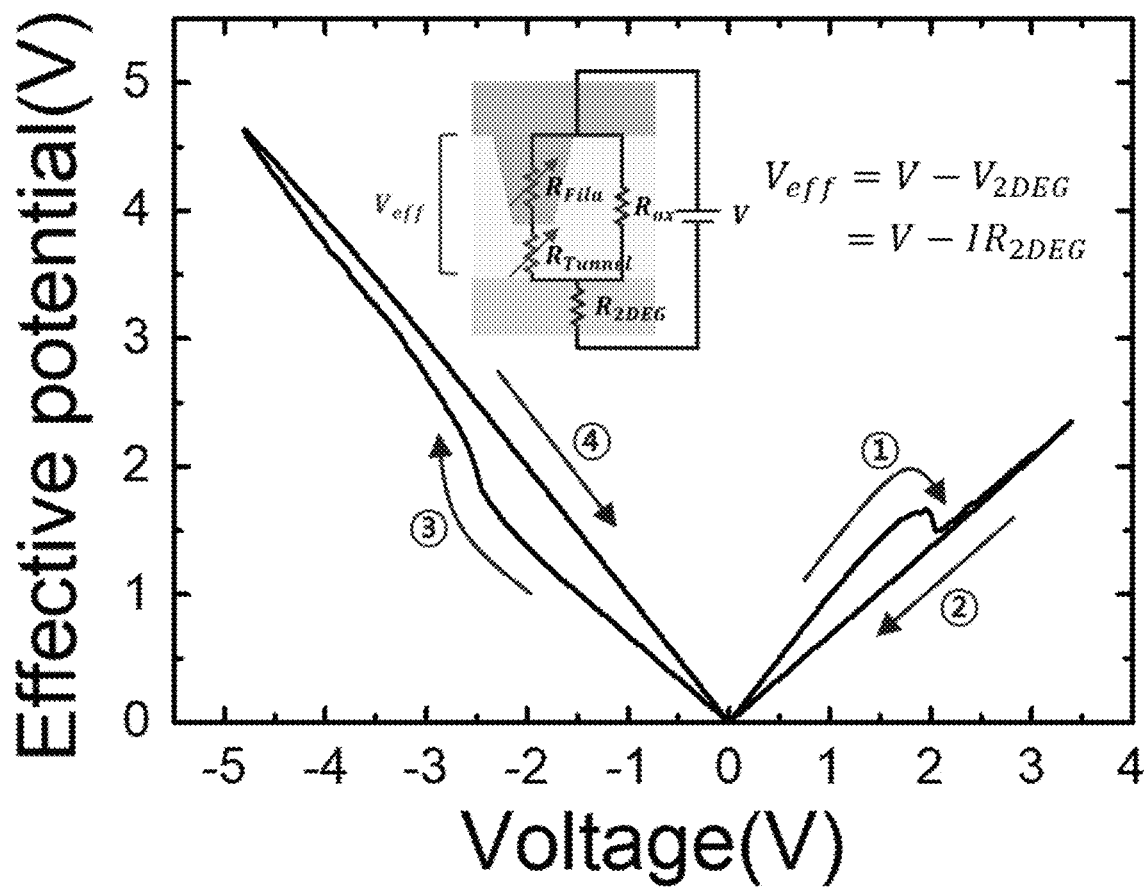
Figure 10D:
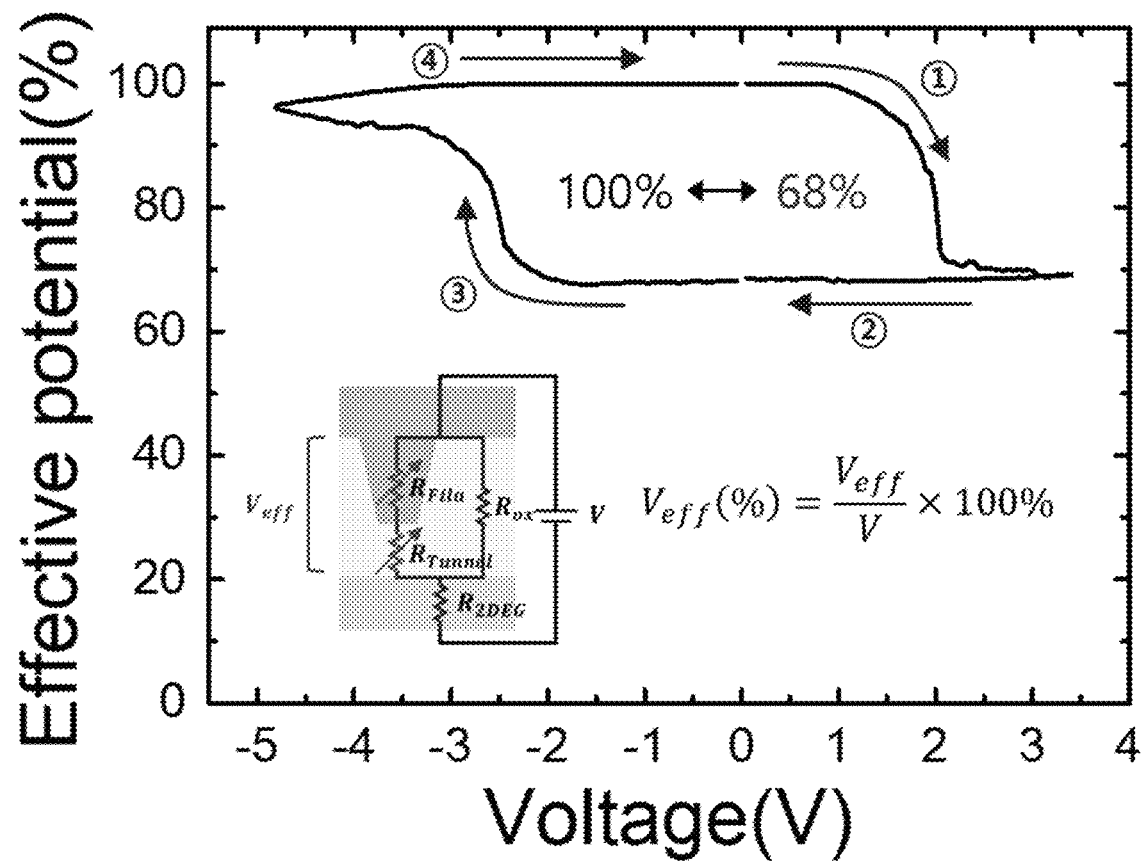

FIG. 10A shows a I-V curve after 100 successive voltage sweeps on a resistive switching element according to Present Example, FIG. 10B shows $R_{Fila}$ (Cu filament resistance), $R_{tunnel}$ (tunnel gap resistance), $R_{OX}$ ($Al_2O_3$ resistance) and $R_{2DGE}$ (2DEG resistance) as extracted from the I-V curve of FIG. 10A, and FIG. 10C and FIG. 10D show calculation results of an effective potential applied to the resistive switching element according to Present Example.

Referring to FIG. 10A, the I-V curve of the two-dimensional electron gas itself ('2DEG only') exhibits an ohmic-like behavior with a resistance of 18 kΩ. The equivalent cell circuits for HRS and LRS states are shown in the insets of FIG. 10A, and resistance values may be extracted from the LRS state. $R_{Fila}$ (Cu filament resistance), $R_{tunnel}$ (tunnel gap resistance), $R_{OX}$ ($Al_2O_3$ resistance) and $R_{2DGE}$ (2DEG resistance) as extracted are shown in FIG. 10B. $R_{2DGE}$ is 18 kΩ, $R_{Fila}$ is 40 kΩ, and the total resistance is 58 kΩ.

In an initial state in which a positive bias is applied to the resistive switching element according to Present Example, most of the electrical bias is applied across the Cu electrode and the two-dimensional electron gas due to the high resistance of $Al_2O_3$. A resistance of an incompletely formed Cu filament is higher than that of the two-dimensional electron gas, such that the Cu ions migrate toward the two-dimensional electron gas to form a Cu filament. However, as the resistance of the Cu filament is closer to a resistance value of the two-dimensional electron gas, the movement of additional Cu ions is suppressed because a substantial portion of an electrical bias is applied to the two-dimensional electron gas due to the resistance of the two-dimensional electron gas. Therefore, the resistances of the Cu filament and the two-dimensional electron are similar to each other. This leads to the formation of a smaller filament with a high resistance of 40 kΩ. The total resistance of the resistive switching element of 58 kΩ is determined based on the resistance of the two-dimensional electron gas of 18 kΩ and the resistance of the filament of 40 kΩ. Because of the resistance of the two-dimensional electron gas connected in series thereto, the resistance of the Cu filament reaches that of the two-dimensional electron gas. Therefore, in the resistive switching element according to Present Example, compliance current setting for the set process which is essentially required in the previously reported resistive switching element is not required. This intrinsic current compliance effect may enable the omission of additional circuitry for compliance current regulation.

It has been identified that the effective voltage applied to the Cu filament is reduced during the set process. This may limit excessive Cu migration just before the set process. This may lead to a uniform set process.

As shown in FIG. 10C and FIG. 10D, the voltage applied to the resistive switching element is partially applied to each of the Cu filament and the two-dimensional electron gas. When a low voltage is applied thereto before the SET occurrence, most of the voltage is applied to the Cu filament and the solid electrolyte because the resistance of the Cu filament is higher than that of the two-dimensional electron gas.

However, as the positive voltage increases, the Cu filament grows. Thus, the resistance of the Cu filament decreases until it becomes similar to that of the two-dimensional electron gas. This may reduce the effective potential applied to the Cu filament. A relative potential applied to the filament is shown in FIG. 10D.

Generally, the resistance of the Cu filament decreases with increasing positive voltage until the resistance of the Cu filament reaches that of the two-dimensional electron gas. Due to the reduction of the voltage across the Cu filament at the end of the set process, a smaller filament is formed. Thus, the uniform I-V curves may be achieved. Further, because the reduction rate of Cu ions in the two-dimensional electron gas is low due to the low work function of the two-dimensional electron gas, the further smaller filament may be formed. The combination of the above characteristics allows for improved control of the formation and destruction of the Cu filament.

Figure 11A:
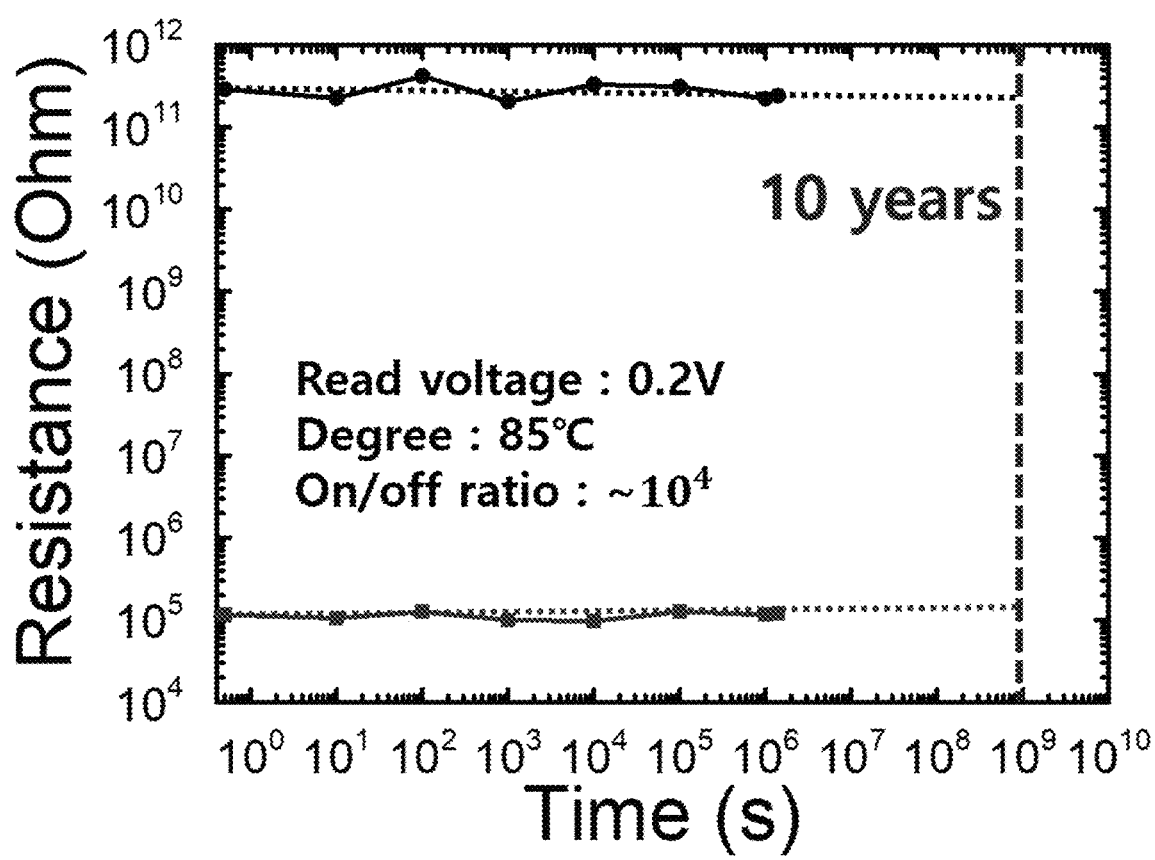
FIG. 11A shows resistance values at 85° C. in HRS and LRS states over time of a resistive switching element according to Present Example.
Figure 11B:
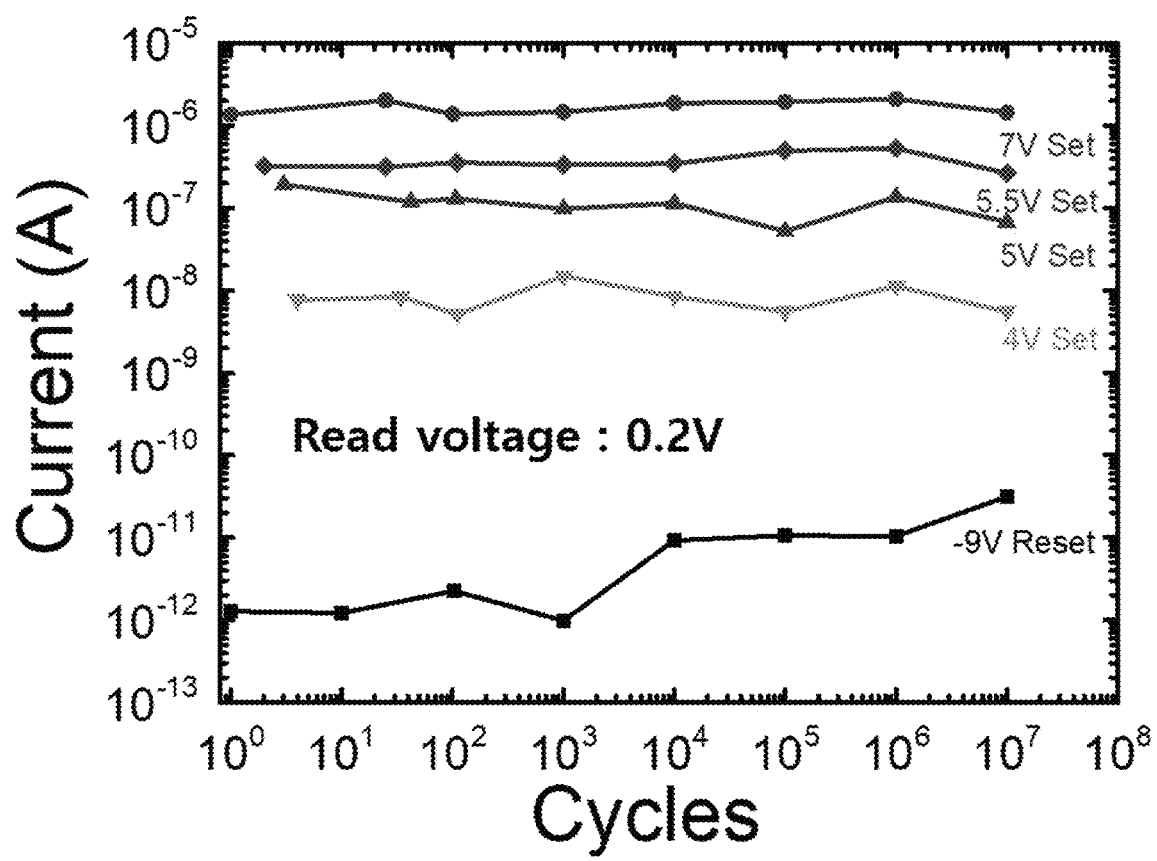
FIG. 11B shows a durability test result of the resistive switching element according to Present Example.

FIG. 11A shows resistance values at 85° C. in HRS and LRS states over time of a resistive switching element according to Present Example, and FIG. 11B shows a durability test result of the resistive switching element according to Present Example.

As shown in FIG. 11A, HRS and LRS resistances of the resistive switching element according to Present Example at a read voltage of 2V are maintained to be constant for a duration equal to or greater than $10^6$ s and at 85° C. That is, a data retention time duration of the resistive switching element according to Present Example exceeds $10^6$ s at 85° C., which may be compared to the best results obtained from a CBRAM element based on Cu migration.

Because a filament which is rigid in the vicinity of the two-dimensional electron gas and is large in the upper portion is formed, the element has excellent data retention ability despite the small size of the filament in the vicinity of the two-dimensional electron gas. That is, although the size of the Cu filament in the vicinity of the two-dimensional electron gas is small, this size is sufficient to maintain a rigid metal filament.

As shown in FIG. 11B, uniform resistive switching characteristics are maintained over $10^7$ cycles without the compliance current setting. An on/off ratio greater than or equal to $10^5$ is maintained even after $10^7$ cycles. This result surpasses a previously reported result.

Although the descriptions have been made with reference to the preferred embodiments of the present disclosure, those skilled in the art may variously modify and change the present disclosure without deviating from the spirit and scope of the present disclosure as described in the claims below.

What is claimed is:

1. A resistive switching element comprising:
   a first oxide layer and a second oxide layer stacked one on top of the other such that an interface is present therebetween, wherein the first oxide layer and the second oxide layer are made of different metal oxides;
   two-dimensional electron gas (2DEG) present in the interface between the first oxide layer and the second oxide layer and functioning as an inactive electrode; and
   an active electrode disposed on the second oxide layer,
   wherein when a positive bias is applied to the active electrode, an electric field is generated between the active electrode and the two-dimensional electron gas, such that the second oxide layer is subjected to the electric field, and active metal ions from the active electrode are injected into the second oxide layer.

2. The resistive switching element of claim 1, wherein each of the first and second oxide layers is made of a metal oxide including at least one metal element selected from a group consisting of titanium (Ti), zinc (Zn), aluminum (Al), hafnium (Hf), zirconium (Zr), gallium (Ga) and tungsten (W).

3. The resistive switching element of claim 2, wherein each of the first and second oxide layers is made of a metal oxide selected from a group consisting of titanium oxide, zinc oxide, aluminum oxide, hafnium oxide, zirconium oxide, gallium oxide and tungsten oxide.

4. The resistive switching element of claim 2, wherein the first oxide layer is made of titanium dioxide ($TiO_2$) or strontium titanate ($SrTiO_3$) while the second oxide layer is made of aluminum oxide ($Al_2O_3$), lanthanum aluminate ($LaAlO_3$), tungsten trioxide ($WO_3$) or tungsten dioxide ($WO_2$).

5. The resistive switching element of claim 1, wherein the active electrode is made of an electrically conductive material including copper (Cu) or silver (Ag).

6. The resistive switching element of claim 5, wherein the active electrode includes:
an active metal layer made of an active metal including copper (Cu) or silver (Ag); and
a buffer layer made of titanium (Ti) and disposed between the active metal layer and the second oxide layer.

7. The resistive switching element of claim 1, wherein when the positive bias is applied to the active electrode such that a first electric field is generated between the active electrode and the two-dimensional electron gas, a conductive filament electrically connecting the active electrode and the two-dimensional electron gas to each other is formed inside the second oxide layer so that the second oxide layer is brought into a low resistance state (LRS),
wherein when a negative bias is applied to the active electrode such that a second electric field having a direction opposite to a direction of the first electric field is generated between the active electrode and the two-dimensional electron gas, a portion of the conductive filament adjacent to the two-dimensional electron gas is destroyed such that the second oxide layer is brought into a high resistance state (HRS).

8. The resistive switching element of claim 7, wherein when the second oxide layer is in the high resistance state, a tunnel gap between an end of the filament and the two-dimensional electron gas is in a range of 0.1 to 0.5 nm.

9. The resistive switching element of claim 7, wherein when the second oxide layer is in the low resistance state, a resistance of the conductive filament is in a range of 95% to 105% of a resistance of the two-dimensional electron gas.

10. The resistive switching element of claim 7, wherein different voltages are respectively applied to the active electrode and the two-dimensional electron gas.

11. A memory device comprising:
a plurality of resistive switching elements arranged in a matrix of M×N along a first horizontal direction and a second horizontal direction intersecting with each other;
a plurality of first signal lines arranged to be spaced apart from each other in the second horizontal direction, wherein each of the plurality of first signal lines extends in the first horizontal direction and is electrically connected to active electrodes of M resistive switching elements arranged in a line along the first horizontal direction among the plurality of resistive switching elements; and
a plurality of second signal lines arranged to be spaced apart from each other in the first horizontal direction, wherein each of the plurality of second signal lines extends in the second horizontal direction and is electrically connected to two-dimensional electron gases of N resistive switching elements arranged in a line along the second horizontal direction among the plurality of resistive switching elements,
wherein each of the plurality of resistive switching elements includes:
a first oxide layer and a second oxide layer stacked one on top of the other such that an interface is present therebetween, wherein the first oxide layer and the second oxide layer are made of different metal oxides;
the two-dimensional electron gas (2DEG) present in the interface between the first oxide layer and the second oxide layer and functioning as an inactive electrode; and
the active electrode disposed on the second oxide layer,
wherein when a positive bias is applied to the active electrode via the first signal line, an electric field is generated between the active electrode and the two-dimensional electron gas, such that the second oxide layer is subjected to the electric field, and active metal ions from the active electrode are injected into the second oxide layer.

12. The memory device of claim 11, wherein each of the plurality of resistive switching elements further includes a support structure disposed on a corresponding one of the second signal lines and having a columnar structure,
wherein the first oxide layer covers side and top faces of the support structure,
wherein the second oxide layer are disposed on the side and top faces of the support structure so as to directly cover the first oxide layer.

13. The memory device of claim 12, wherein the support structure has the columnar structure having a circular or polygonal cross-sectional shape.

14. The memory device of claim 12, wherein each of the second signal lines are in direct contact with exposed bottom faces of the two-dimensional electron gases coplanar with bottom faces of the support structures.

15. The memory device of claim 12, wherein when the positive bias is applied to the active electrode such that a first electric field is generated between the active electrode and the two-dimensional electron gas, a conductive filament electrically connecting the active electrode and the two-dimensional electron gas to each other is formed in a portion of the second oxide layer between a top face of the support structure and the active electrode so that the second oxide layer is brought into a low resistance state (LRS),
wherein when a negative bias is applied to the active electrode such that a second electric field having a direction opposite to a direction of the first electric field is generated between the active electrode and the two-dimensional electron gas, a portion of the conductive filament adjacent to the two-dimensional electron gas is destroyed such that the second oxide layer is brought into a high resistance state (HRS).

16. The memory device of claim 12, wherein the device further comprises a filling layer fills a space between adjacent ones of the plurality of resistive switching elements,
wherein the active electrodes of the resistive switching elements are exposed through openings defined in a top portion of the filling layer and are electrically connected to the first signal lines.

17. The memory device of claim 16, wherein the filling layer includes a first layer filling the space between adjacent ones of the resistive switching elements, and a second layer formed on a top face of the first layer,
wherein the first layer exposes a portion of a top face of the second oxide layer of each of the resistive switching elements,
wherein the second layer has the openings defined therein through which the active electrodes of the resistive switching elements respectively extend.

* * * * *